US012677664B2

(12) United States Patent
Kuo et al.

(10) Patent No.: US 12,677,664 B2
(45) Date of Patent: Jul. 7, 2026

(54) STRESS REDUCTION STRUCTURES FOR A SEMICONDUCTOR DIE IN A COMPOSITE PACKAGE AND METHODS OF FORMING THE SAME

(71) Applicant: Taiwan Semiconductor Manufacturing Company Limited, Hsinchu (TW)

(72) Inventors: Ting Hao Kuo, Hsinchu City (TW); Chen-Shien Chen, Zhubei City (TW); Yu-Chia Lai, Zhunan Township (TW); Cheng-Hsin Chen, Toufen City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 359 days.

(21) Appl. No.: 18/460,658

(22) Filed: Sep. 4, 2023

(65) Prior Publication Data

US 2025/0079346 A1      Mar. 6, 2025

(51) Int. Cl.
| | |
|---|---|
| *H10W 42/00* | (2026.01) |
| *H10W 20/42* | (2026.01) |
| *H10W 74/10* | (2026.01) |
| *H10W 90/00* | (2026.01) |

(52) U.S. Cl.
CPC .......... *H10W 42/00* (2026.01); *H10W 20/42* (2026.01); *H10W 74/111* (2026.01); *H10W 90/00* (2026.01); *H10W 90/722* (2026.01)

(58) Field of Classification Search
CPC ... H10W 42/00; H10W 20/42; H10W 74/111; H10W 90/00; H10W 90/722; H10W 42/121; H10W 74/014; H10W 74/019; H10W 74/117
See application file for complete search history.

(56) References Cited

U.S. PATENT DOCUMENTS

| | | | | |
|---|---|---|---|---|
| 2006/0012012 A1* | 1/2006 | Wang | .................. | H10W 42/121 257/E23.194 |
| 2006/0103025 A1* | 5/2006 | Furusawa | ............. | H10W 42/00 257/E23.129 |
| 2012/0038028 A1* | 2/2012 | Yaung | ..................... | H10P 54/00 257/E23.18 |
| 2014/0151698 A1* | 6/2014 | Chen | ..................... | H10P 74/277 438/18 |
| 2014/0264745 A1* | 9/2014 | Yen | ........................ | H10W 42/20 257/532 |

* cited by examiner

*Primary Examiner* — Thanh T Nguyen
(74) *Attorney, Agent, or Firm* — The Marbury Law Group, PLLC

(57) ABSTRACT

A composite package includes a first semiconductor die which includes a semiconductor substrate; dielectric material layers overlying the semiconductor substrate; an edge ring seal structure laterally enclosing the dielectric material layers without any lateral opening therethrough; at least one passivation dielectric layer overlying the dielectric material layers; and a capping metal ring contacting a top surface segment of the edge ring seal structure and laterally surrounding a lower portion of the at least one passivation dielectric layer. Each corner region of the at least one passivation dielectric layer is free of any metallic material other than a respective single slanted bar segment of the capping metal ring. Alternatively or additionally, a spacer metal ring having a different height than the capping metal ring may be formed within the at least one passivation dielectric layer.

20 Claims, 30 Drawing Sheets

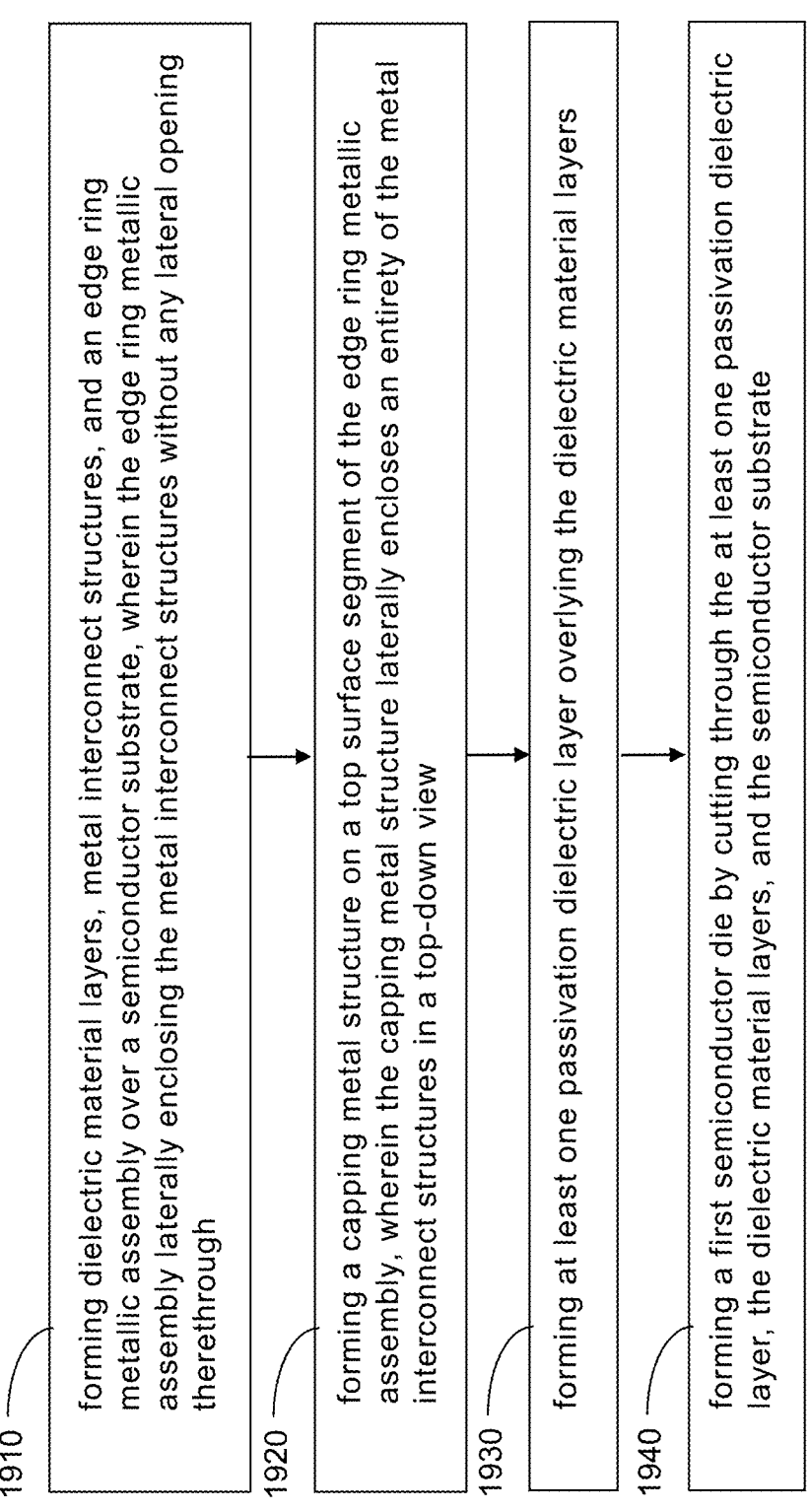

1910 — forming dielectric material layers, metal interconnect structures, and an edge ring metallic assembly over a semiconductor substrate, wherein the edge ring metallic assembly laterally enclosing the metal interconnect structures without any lateral opening therethrough 1920 — forming a capping metal structure on a top surface segment of the edge ring metallic assembly, wherein the capping metal structure laterally encloses an entirety of the metal interconnect structures in a top-down view 1930 — forming at least one passivation dielectric layer overlying the dielectric material layers 1940 — forming a first semiconductor die by cutting through the at least one passivation dielectric layer, the dielectric material layers, and the semiconductor substrate

FIG. 19

STRESS REDUCTION STRUCTURES FOR A SEMICONDUCTOR DIE IN A COMPOSITE PACKAGE AND METHODS OF FORMING THE SAME

BACKGROUND

Typically, an edge seal structure is used for a semiconductor die that if formed within a molding compound die frame in a composite package such as a silicon-on-integrated-chip package. However, mismatches between the various coefficients of thermal expansion of the edge seal structures and the molding compound die frame may generate large mechanical stress during usage of the composite package. Such mechanical stress may trigger stress cracks and functional failures in the composite package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19 is a flowchart illustrating steps for forming a device structure according to an embodiment of the present disclosure.

DETAILED DESCRIPTION

Figure 1A:
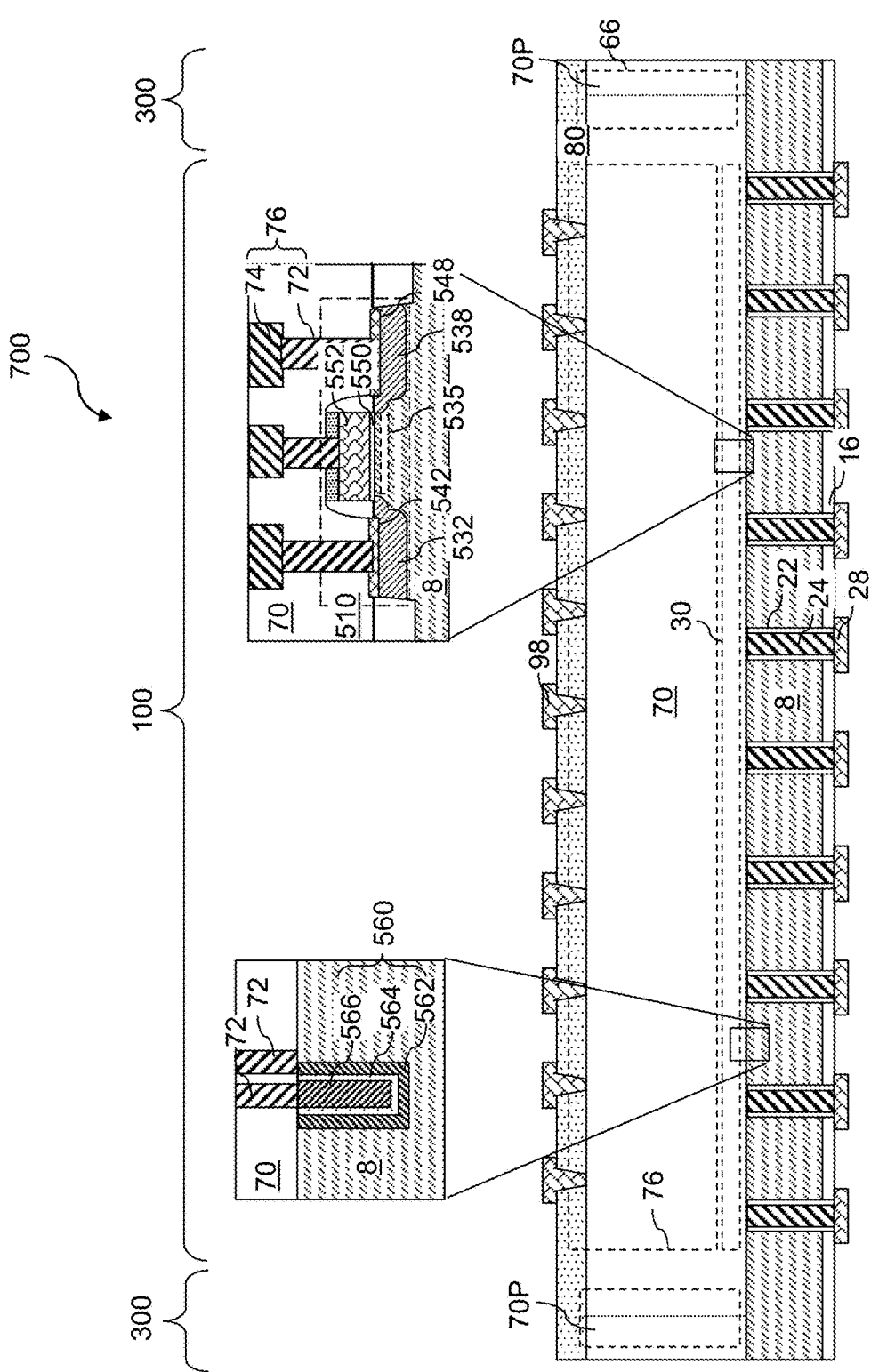
FIG. 1A is a vertical cross-sectional view of a semiconductor die according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments of the present disclosure provide device structures including at least one semiconductor die, which is configured to provide stress reduction within a molding compound die frame. Generally, an annular capping metal ring located at a periphery of a semiconductor die at the level of a passivation dielectric layer generates mechanical stress due to mismatches of the thermal expansion coefficient of the annular capping metal ring as compared to the thermal expansion coefficient of the molding compound die frame. Embodiments of the present disclosure provide an annular capping metal ring that is configured to reduce stress in corner regions of a semiconductor die. An edge ring seal structure may be provided in a semiconductor die such that the edge ring seal structure laterally encloses metal interconnect structures formed within dielectric material layers. The edge ring seal structure may include four slanted corner segments that connect a respective lengthwise segment and a respective widthwise segment of the edge ring seal structure. Each corner region of at least one passivation dielectric layer may be free of any metallic material other than a respective single slanted bar segment of the capping metal ring. Alternatively or additionally, a spacer metal ring may be formed within the at least one passivation dielectric layer, and may be located inside the capping metal ring such that the spacer metal ring has a topmost surface that is located above a horizontal plane including a topmost surface of the capping metal ring. The geometries of the capping metal ring and the layer composition of the at least one passivation dielectric layer may be selected to reduce stress of the semiconductor die upon its placement within a molding compound die frame. Various aspects of the present invention are now described with reference to accompanying drawings.

Figure 1B:
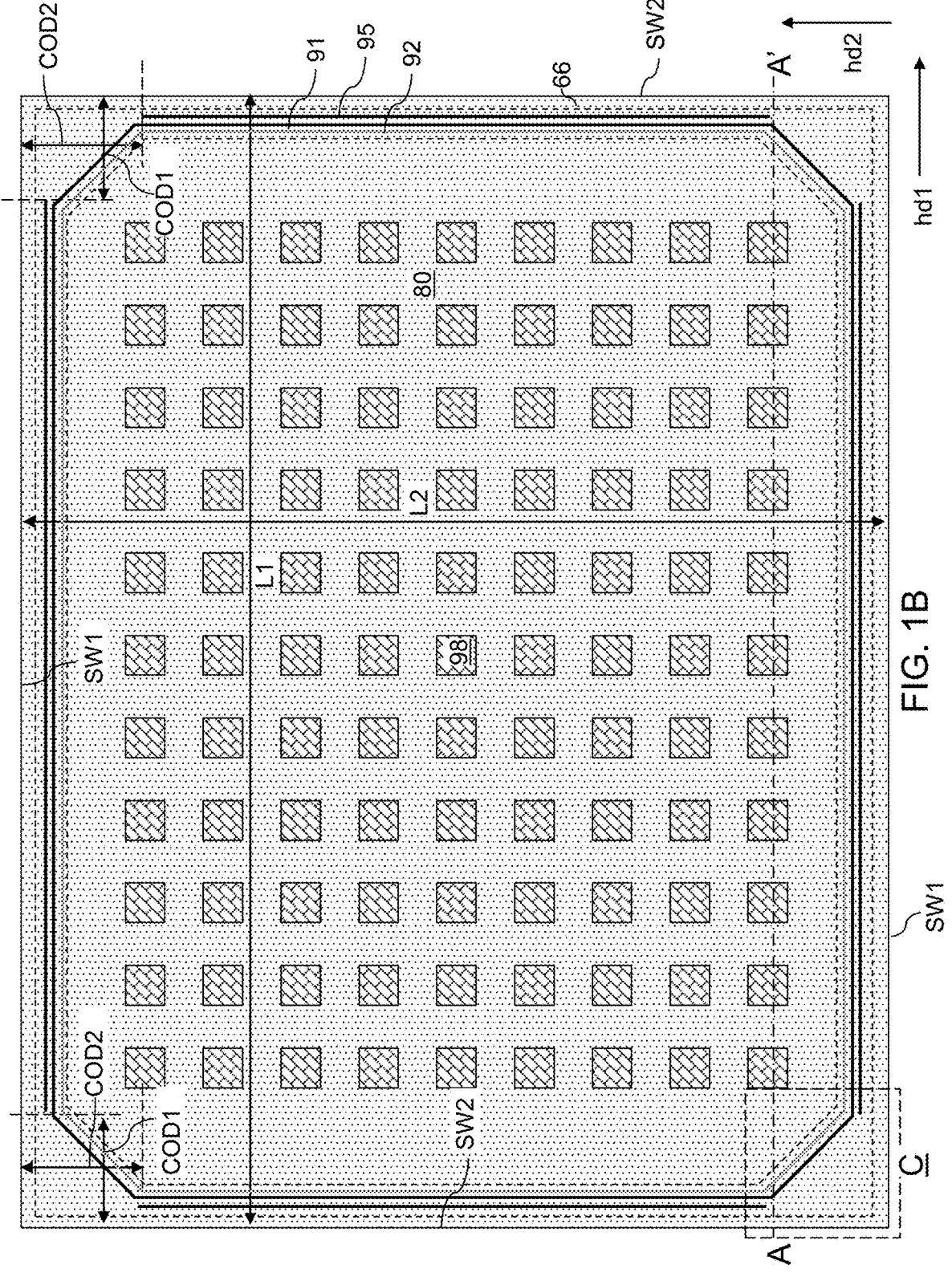
FIG. 1B is a partial see-through top-down view of the embodiment semiconductor die of FIG. 1A in instances in which the semiconductor die is in a first configuration according to an embodiment of the present disclosure. The vertical plane A-A' is the cut plane of the vertical cross-sectional view of FIG. 1A.
Figure 1C:
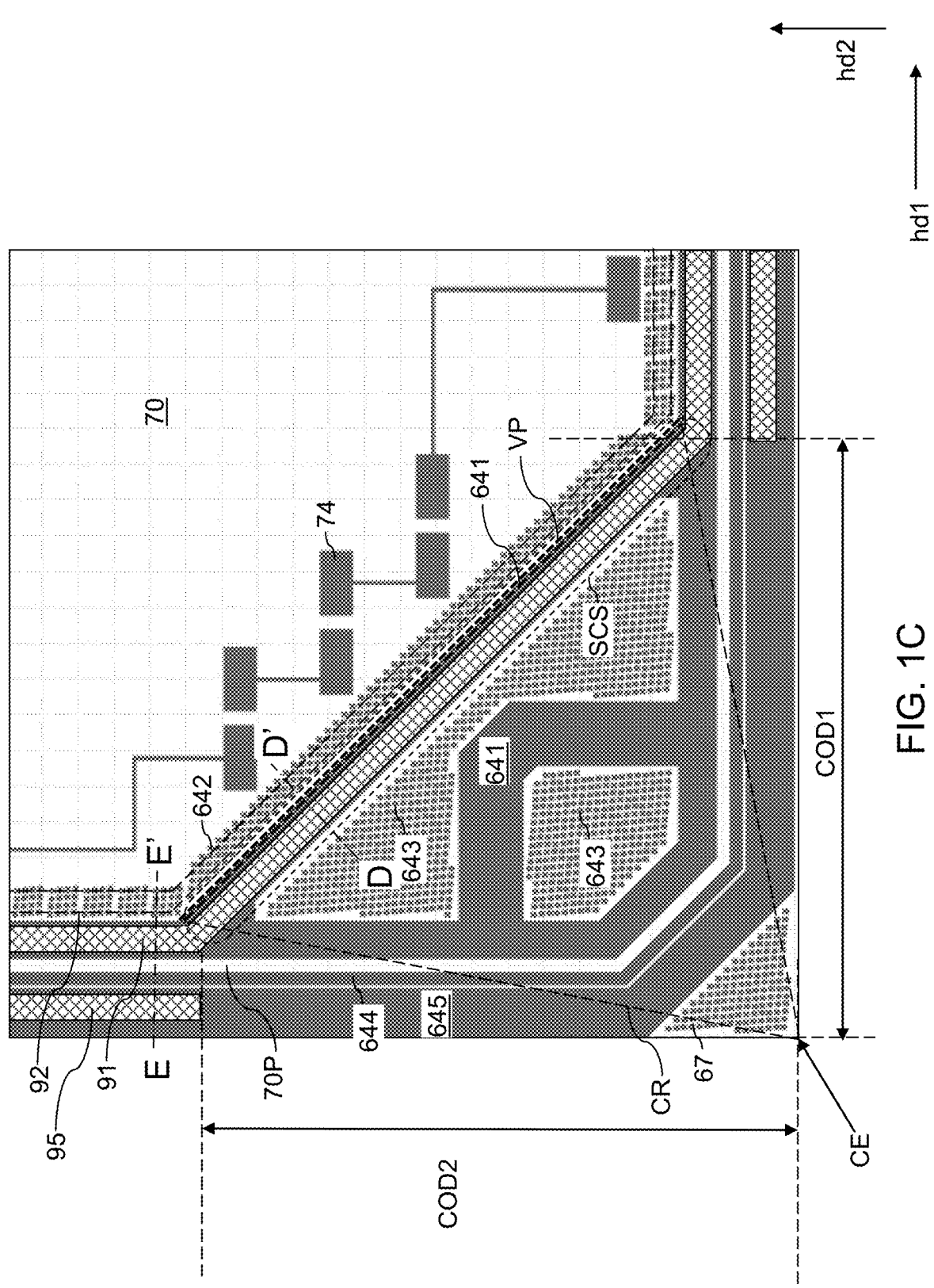
FIG. 1C is a magnified view of region C in FIG. 1B.
Figure 1D:
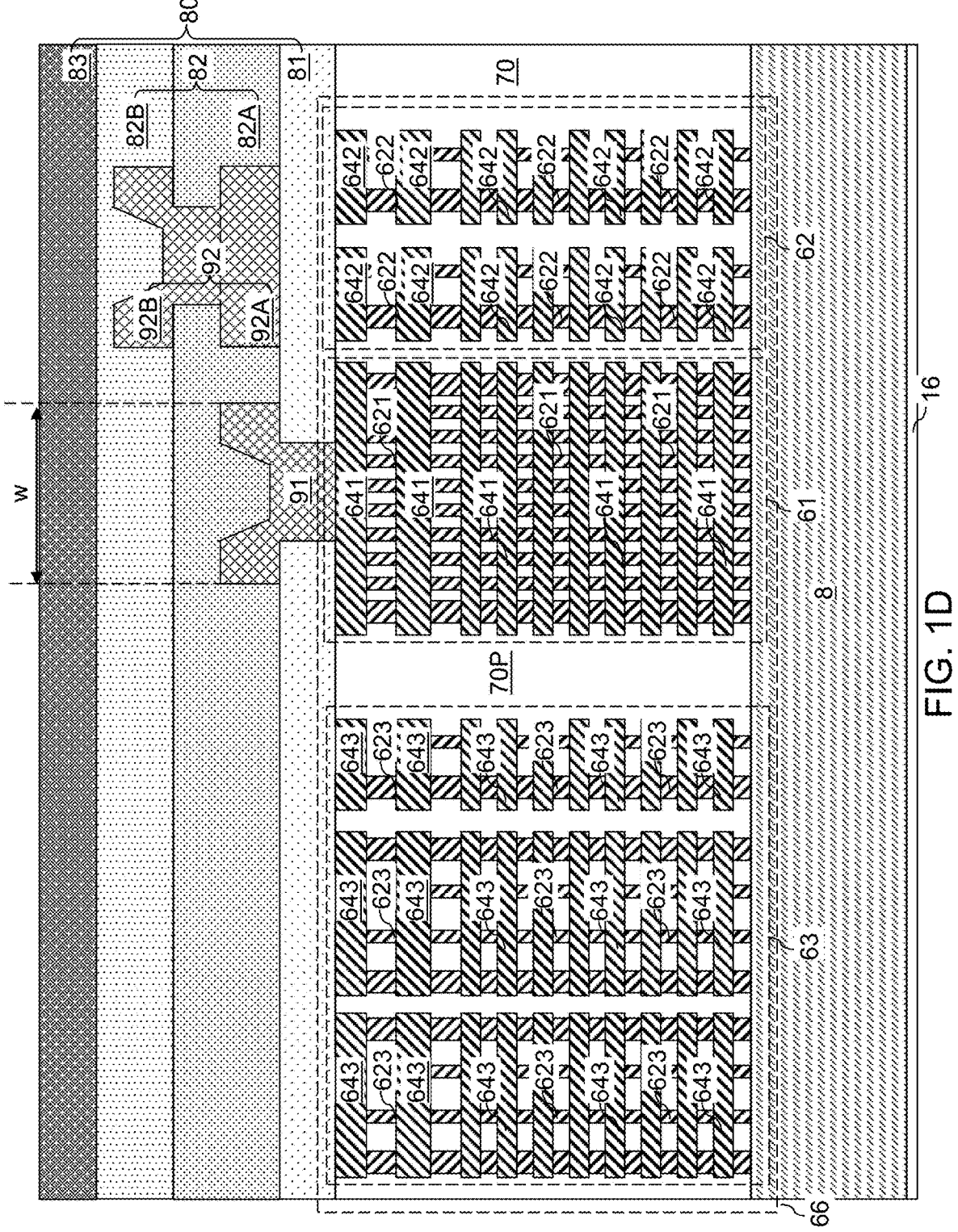
FIG. 1D is a vertical cross-sectional view of a first region of the embodiment semiconductor die of FIGS. 1A-1C along the vertical plane D-D' of FIG. 1C.
Figure 1E:
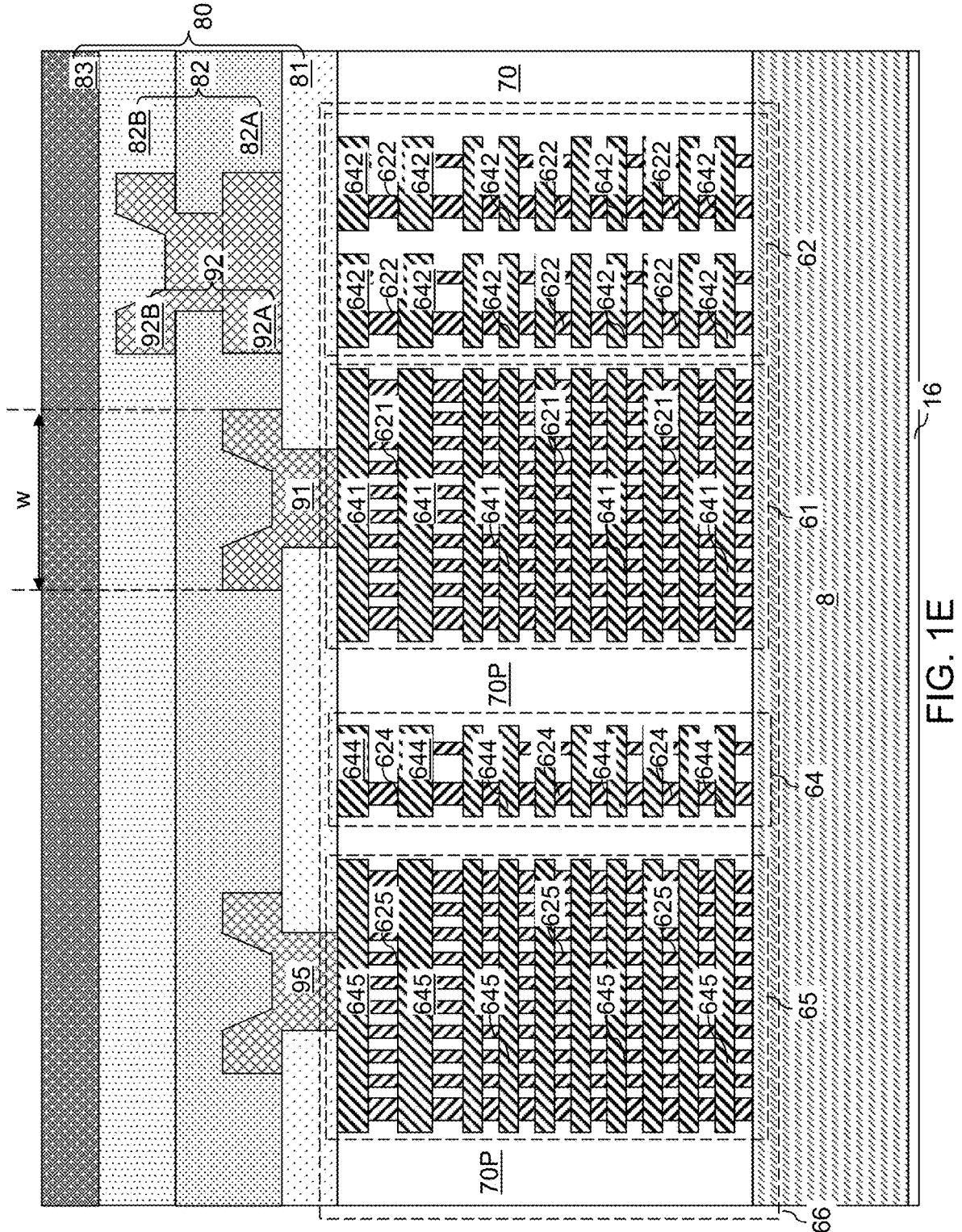
FIG. 1E is a vertical cross-sectional view of a second region of the embodiment semiconductor die of FIGS. 1A-1C along the vertical plane E-E' of FIG. 1C.

FIG. 1A is a vertical cross-sectional view of a semiconductor die according to an embodiment of the present disclosure. FIG. 1B is a partial see-through top-down view of the embodiment semiconductor die of FIG. 1 in instances in which the semiconductor die is in a first configuration according to an embodiment of the present disclosure. The vertical plane A-A' is the cut plane of the vertical cross-sectional view of FIG. 1A. FIG. 1C is a magnified view of region C in FIG. 1B. FIG. 1D is a vertical cross-sectional view of a first region of the embodiment semiconductor die of FIGS. 1A-1C along the vertical plane D-D' of FIG. 1C. FIG. 1E is a vertical cross-sectional view of a second region of the embodiment semiconductor die of FIGS. 1A-1C along the vertical plane E-E' of FIG. 1C.

Referring to FIGS. 1A-1E, various views of a semiconductor die 700 is illustrated according to an embodiment of the present disclosure. The embodiment semiconductor die 700 is hereafter referred to as a semiconductor die 700, and may be subsequently used as any semiconductor die such as a first semiconductor die and/or a second semiconductor die to be formed (e.g., placed and molding compound die frame formed around) in a respective molding compound die frame described below. Each semiconductor die 700 may comprise a device region 100 and a peripheral region 300. The device region 100 comprises semiconductor devices 30 and/or metal interconnection structures including metal interconnect structures 76, and the peripheral region 300 comprises peripheral metal structures 66. Generally, the peripheral region 300 may have a shape of a frame (in top down view) having an outer rectangular periphery and an inner octagonal periphery having four major straight sides and four slanted corner sides having lesser lateral extents than any of the four major straight sides.

Generally, a semiconductor wafer including a semiconductor substrate 8 may be provided. The semiconductor wafer may be a commercially available semiconductor wafer. For example, the semiconductor wafer may comprise a single crystalline silicon wafer. Semiconductor devices 30 may be formed on the top surface of, within, and/or over the semiconductor substrate 8.

Through-substrate via (TSV) structures 24 may be formed in an upper portion of the semiconductor substrate within the device region 100. The TSV structures 24 may be electrically isolated from the semiconductor substrate 8 by insulating liners 22. After formation of semiconductor devices 30, dielectric material layers 70, at least one passivation dielectric layer 80, and front bonding structures 98, the semiconductor wafer may be thinned from the backside to expose backside surfaces of the TSV structures 24. After the semiconductor substrate 8 is thinned, a backside insulating layer 16 may be deposited on the recessed backside surface of the semiconductor substrate 8. Backside bonding structures 28 may be formed on the backside surface of the TSV structures 24. The combination of the semiconductor wafer (as thinned), the dielectric material layers 70, and the at least one passivation dielectric layer 80 may be diced along dicing channels to provide a plurality of semiconductor dies 700, one of which is illustrated in FIGS. 1A-1E.

In one embodiment, the semiconductor devices 30 may comprise at least one field effect transistor 510 (e.g., a semiconductor device 30) located on, or above, the semiconductor substrate 8. Each field effect transistor 510 may comprise a source region 532, a drain region 538, a gate dielectric 550, a gate electrode 552, and a semiconductor channel 535. In some embodiments, one or more of the field effect transistors 510 may comprise a source metal-semiconductor alloy portion 542 and a drain metal-semiconductor alloy portion 548. The at least one field effect transistor 510 may comprise at least one planar field effect transistor, at least one fin field effect transistor, at least one gate-all-around transistor, at least one 2-dimensional-channel field effect transistor, at least one vertical field effect transistor, and/or at least one thin film transistor.

Alternatively or additionally, the semiconductor devices 30 may comprise at least one passive semiconductor device such as at least one capacitor 560 such as at least one trench capacitor and/or at least one thin film capacitor. Each capacitor 560 may comprise a first electrode 562, a node dielectric 564, and a second electrode 566.

Dielectric material layers 70, metal interconnect structures 76, and various peripheral metal stack structures 66 may be formed over the semiconductor substrate 8. The dielectric material layers 70 comprise interlayer dielectric (ILD) materials such as undoped silicate glass, a doped silicate glass, porous or non-porous organosilicate glass, silicon nitride, silicon oxynitride, and dielectric metal oxides. In one embodiment, the dielectric material layers may comprise, and/or may consist essentially of, a non-polymer dielectric material, i.e., a dielectric material that is not a polymer material.

The metal interconnect structures 76 comprise metal via structures 72 and metal line structures 74 that are formed within the dielectric material layers 70. The metal via structures 72 and the metal line structures 74 may provide electrical connection to and from the semiconductor devices 30 and may provide electrically conductive paths between the front bonding structures 98 and the TSV structures 24, and thus, between the front bonding structures 98 and the backside bonding structures 28.

The peripheral metal structures 66 comprise an edge ring seal structure 61 (see e.g., FIGS. 1D and 1E) that laterally enclose each of the metal interconnect structures 76 as a continuous structure without any laterally opening therethrough, and comprises loop segments laterally enclosing a respective enclosed area at four corner regions of the semiconductor die 700. The edge ring seal structure 61 comprises metal plates 641 and nested metal via structures 621. Each of the metal plates 641 laterally encloses an entire area of the device region 100. Each of the nested metal via structures 621 laterally encloses the entire area of the device region 100. Each of the nested metal via structures 621 located at a same via level may be nested within, or nests therein, the rest of the nested metal via structures 621 located at the same level. As such, the metal plates 641 and the metal via structures 621 within the edge sing seal structure 61 may have a respective opening therethrough that laterally encloses the entirety of the metal interconnect structures 76 in a plan view, i.e., a top-down view in which areas of all elements are shown.

The peripheral metal structures 66 may optionally comprise inner metal stack structures 62 that are laterally enclosed by the edge ring seal structure 61 and laterally enclosing each of the metal interconnect structures. The inner metal stack structures 62 may be laterally spaced apart from one another. Each inner metal stack structure 62 may comprise a vertically alternating sequence of metal plates 642 and metal via structures 622.

The peripheral metal structures 66 may optionally comprise intermediate metal stack structures 63 that are laterally enclosed by a respective loop within the edge ring seal structure 61 as shown, for example, in FIG. 1D. In the illustrated example of FIGS. 1A-1E, the peripheral region 300 of the semiconductor die 700 comprises four corner regions each including two enclosed areas that are laterally enclosed by the edge ring seal structure 61. The intermediate metal stack structures 63 may be located within the enclosed areas that are laterally surrounded by the loop segments of the edge ring seal structure 61. Each intermediate metal stack structure 63 may comprise a vertically alternating sequence of metal plates 643 and metal via structures 623.

The peripheral metal structures 66 may comprise an inner peripheral metal stack ring 64. The inner peripheral metal stack ring 64 laterally encloses the edge ring seal structure 61, and comprises a vertically alternating sequence of metal rings 644 and metal via structures 624. Each metal ring 644 may be topologically homeomorphic to a torus, i.e., may be continuously transformed into a shape of a torus without formation of a new hole and without removing any existing hole. Neighboring pairs of metal rings 644 may be vertically spaced apart from each other by a plurality of metal via structures 624 that are laterally spaced apart from one another. Thus, lateral openings are present within the inner peripheral metal stack ring 64 between neighboring pairs of metal via structures 624. Presence of the lateral perforations in the inner peripheral metal stack ring 64 contributes in the reduction of mechanical stress generated by the inner peripheral metal stack ring 64 during thermal expansion of the semiconductor die 700.

The peripheral metal structures 66 may comprise an outer peripheral metal stack ring 65. The outer peripheral metal stack ring 65 laterally encloses the inner peripheral metal stack ring 64 and the edge ring seal structure 61, and comprises a vertically alternating sequence of metal rings 645 and metal via structures 625. Each metal ring 645 may be topologically homeomorphic to a torus. Neighboring pairs of metal rings 645 may be vertically spaced apart from each other by a plurality of metal via structures 625 that are laterally spaced apart from one another. Thus, lateral openings are present within the outer peripheral metal stack ring 65 between neighboring pairs of metal via structures 625. Presence of the lateral perforations in the outer peripheral metal stack ring 65 contributes in the reduction of mechanical stress generated by the outer peripheral metal stack ring 65 during thermal expansion of the semiconductor die 700.

The peripheral metal structures 66 may optionally comprise outer metal stack structures 67 that are located outside the outer peripheral metal stack ring 65 and the edge ring seal structure 61. The outer metal stack structures 67 may be located within the four corner regions of the semiconductor die 700. Each outer metal stack structure 67 may comprise a vertically alternating sequence of metal plates (not expressly labeled) and metal via structures (not expressly shown).

Generally, all metal via structures 72 of the metal interconnect structures 76 and all metal via structures (621, 622, 623, 624, 625) of the peripheral metal structures 66 located at a same via level may be formed simultaneously. Likewise, all metal line structures 74 of the metal interconnect structures 76 and all metal plates (641, 642, 643) and all metal rings (644, 645) of the peripheral metal structures 66 located at a same metal line level may be formed simultaneously. Each of the metal via structures 72 of the metal interconnect structures 76, the metal via structures (621, 622, 623, 624, 625) of the peripheral metal structures 66, the metal line structures 74 of the metal interconnect structures 76, and the metal plates (641, 642, 643) and the metal rings (644, 645) of the peripheral metal structures 66 may comprise a respective metallic liner and a respective metallic fill material portion. Each metallic liner may comprise a metallic barrier material such as TiN, TaN, WN, MON, or a combination thereof. Each metallic fill material portion may comprise, and/or may consist essentially of, a metal such as W, Cu, Al, Co, Ru, and/or Mo, or an intermetallic alloy of at least two metals.

The edge ring seal structure 61 laterally enclosing the metal interconnect structures 76 without any lateral opening therethrough. Thus, a contiguous peripheral annular portion of the dielectric material layers 70 may be disjoined from a contiguous center portion of the dielectric material layers 70 by the edge ring seal structure 61. The contiguous peripheral annular portion of the dielectric material layers 70 is herein referred to as a peripheral dielectric material portion 70P.

According to an aspect of the present disclosure, the octagonal area defined by an inner sidewall of the edge ring seal structure 61 (such as an innermost sidewall of the metal plates 641 of the edge ring seal structure 61) defines four corner regions CR having a respective triangular area in a plan view. Each inner sidewall of a slanted corner segment SCS may define a respective vertical plane VP that contacts the inner sidewall and has a same lateral extent as the inner sidewall of the slanted corner segment SCS. In other words, the edges of the vertical plane VP may coincide with the vertically-extending edges of the inner sidewall of the slanted corner segment SCS.

With reference to FIG. 1C, a triangular area of the corner region CR may be defined by connecting the locations of the two edges of the vertical plane VP and a most proximal corner edge CE of the semiconductor die 700 (i.e., the most proximal one of the four corner edges CE of the semiconductor die 700). Thus, each corner region CR may be defined as a region within an area of a triangle in a plan view such that the apexes of the triangle include points of two vertically-extending edges of a slanted corner segment SCS and a most proximal corner edge CE of the semiconductor die 700 in the plan view. Thus, each corner region of the at least one passivation dielectric layer 80 in the semiconductor die 700 that is located between a vertical plane VP including an inner sidewall of the four slanted corner segments SCS of the edge ring seal structure 61 and a vertical line containing a most proximal corner edge CE of the semiconductor die 700.

At least one passivation dielectric layer 80 is formed over the dielectric material layer 70. Each of the at least one passivation dielectric layer 80 may comprise a respective passivation dielectric material that retards, or blocks, diffusion of impurity elements, hydrogen, and/or moisture. Each of the at least one passivation dielectric layer 80 may comprise silicon nitride, silicon carbide nitride, undoped silicate glass, a doped silicate glass, or a polymer material (such as polyimide or a resin).

In one embodiment, the at least one passivation dielectric layer 80 may comprise a plurality of passivation dielectric layers (81, 82, 83). For example, the at least one passivation dielectric layer 80 may comprise a first passivation dielectric layer 81 contacting a topmost surface of the dielectric material layers 70, at least one second passivation dielectric layer 82 that is formed over the first passivation dielectric layer 81, and a third passivation dielectric layer 83 that is formed over the at least one second passivation dielectric layer 82. In one embodiment, the at least one second passivation dielectric layer 82 may comprise a lower second passivation dielectric layer 82A and an upper second passivation dielectric layer 82B.

A capping metal ring 91 may be formed on a top surface segment of the edge ring seal structure 61. In one embodiment, the capping metal ring 91 may be formed as a single annular structure that laterally encloses the entirety of the device region 100 in a plan view. The capping metal ring 91 is formed as a unitary structure, and may be topologically homeomorphic to a torus. In one embodiment, the capping metal ring 91 laterally encloses the entirety of the metal interconnect structures 76 in a plan view such as a top-down view. In one embodiment, the capping metal ring 91 may be formed entirely within the area of the edge ring seal structure 61.

In one embodiment, a first passivation dielectric layer 81 may be deposited on the topmost surface of the dielectric material layers 70, and an annular line trench may be formed through the first passivation dielectric layer 81. At least one first metallic material may be deposited in the annular line trench and over the first passivation dielectric layer 81, and may be patterned to form the capping metal ring 91. In this embodiment, the capping metal ring 91 may comprise a metal via portion that vertically extends through the first passivation dielectric layer 81, and a ring-shaped metal plate portion that overlies the horizontal plane including the top surface of the first passivation dielectric layer 81. In one embodiment, the capping metal ring 91 may comprise a different metallic material than the metal interconnect structure 76 and the edge ring seal structure 61. In one embodiment, the capping metal ring 91 may comprise a material selected from copper, an aluminum-copper alloy, and an aluminum-copper-silicon alloy. In one embodiment, the capping metal ring 91 may comprise an aluminum-based material including aluminum at an atomic percentage greater than 90%.

In one embodiment, the width w of the capping metal ring 91, as measured between an inner sidewall and an outer sidewall of the ring-shaped metal plate portion, may be in a range from 3.2 microns to 7.2 microns. The width of the metal via portion may be less than the width w of the capping metal ring 91 as measured at the level of the ring-shaped metal plate portion. According to an aspect of the present disclosure, the width w of the capping metal ring 91 is selected to ensure that the capping metal ring 91 provides sufficient protection against diffusion of impurities and hydrogen atoms. Thus, a width w greater than 3.2 micron is preferred. Further, the width w of the capping metal ring 91 is selected to minimize adverse stress effects due to thermal expansion of the capping metal ring 91. Thus, a width w less than 7.2 microns is preferred.

According to an aspect of the present disclosure, the edge ring seal structure 61 laterally encloses a non-regular octagonal area of the semiconductor die 700 in a plan view. In one embodiment, the edge ring seal structure 61 comprises two lengthwise segments that are parallel to first sidewalls SW1 of the semiconductor die 700, two widthwise segments that are parallel to second sidewalls SW2 of the semiconductor die 700, and four slanted corner segments SCS that connect a respective one of the two lengthwise segments and a respective one the two widthwise segments. The angle of the lengthwise direction between each slanted corner segment SCS and the first horizontal direction hd1 may be in a range from 30 degrees to 60 degrees, and may be 45 degrees.

With reference to FIG. 1B, in an illustrated example, the two first sidewalls SW1 of the semiconductor die 700 may be parallel to a first horizontal direction hd1, and may have a first length L1, which may be in a range from 1 mm to 40 mm, although lesser and greater lengths may also be used. The two second sidewalls SW2 of the semiconductor die 700 may be parallel to a second horizontal direction hd2, and may have a second length L2, which may be in a range from 1 mm to 40 mm, although lesser and greater lengths may also be used.

In one embodiment, the capping metal ring 91 may have a shape of an octagonal frame in a plan view. In one embodiment, the capping metal ring 91 comprises two first bar segments that are parallel to first sidewalls SW1 of the semiconductor die 700, two second bar segments that are parallel to second sidewalls SW2 of the semiconductor die 700, and four slanted bar segments that connect a respective one of the two first bar segments and a respective one the two second bar segments and located in a respective corner region CR of the at least one passivation dielectric layer 80. In one embodiment, each of the four slanted bar segments has a width in a range from 3.2 microns to 7.2 microns.

In one embodiment, each region at which one of the four slanted bar segments of the capping metal ring 91 is adjoined to a respective one of the two first bar segments and the two second bar segments of the capping metal ring 91 may be laterally spaced from a sidewall selected from the two first sidewalls SW1 and the second sidewalls SW2 of the semiconductor die 700 by an offset distance, which is herein referred to as a corner offset distance. For example, each region at which a slanted bar segment of the capping metal ring 91 is adjoined to a first bar segment of the capping metal ring 91 that laterally extends along the first horizontal direction hd1 may be laterally spaced from a proximal second sidewall SW2 of the semiconductor die 700 by a first corner offset distance COD1, and each region at which a slanted bar segment of the capping metal ring 91 is adjoined to a second bar segment of the capping metal ring 91 that laterally extends along the second horizontal direction hd2 may be laterally spaced from a proximal first sidewall SW1 of the semiconductor die 700 by a second corner offset distance COD2.

According to an aspect of the present disclosure, each of the first corner offset distance COD1 and the second corner offset distance COD2 may be in a range from 27 microns to 90 microns. Generally, a large corner offset distance (COD1, COD2) increases the total area of the corner regions CR, and decreases the size of the device region 100 of the semiconductor die 700. Thus, it is preferred that each of the first corner offset distance COD1 and the second corner offset distance COD2 be less than 90 microns. However, a small corner offset distance (COD1, COD2) decreases the lateral distance between the capping metal ring 91 and the corner edges CE of the semiconductor die 700, and increases the mechanical stress generated by thermal mismatch between the capping metal ring 91 and a molding compound die frame to be subsequently formed. Thus, it is preferred that each of the first corner offset distance COD1 and the second corner offset distance COD2 be greater than 27 microns.

The first length L1 of the semiconductor die 700 and the first corner offset distance COD1 of the capping metal ring 91 determines the length of each first bar segment of the capping metal ring 91 that laterally extends along the first horizontal direction hd1. Specifically, the length of each first bar segment of the capping metal ring 91 equals the first length L2 less twice the first corner offset distance COD1. Likewise, the second length L2 of the semiconductor die 700 and the second corner offset distance COD2 of the capping metal ring 91 determines the length of each second bar segment of the capping metal ring 91 that laterally extends along the second horizontal direction. Specifically, the length of each second bar segment of the capping metal ring 91 equals the second length L2 less twice the second corner offset distance COD2.

In one embodiment, the ratio of the length of one of the two first bar segments of the capping metal ring 91 to the length of one of the first sidewalls SW1 of the semiconductor die 700 (i.e., the first length L1) may be in a range from 0.8500 to 0.9948. In one embodiment, the ratio of the length of one of the two second bar segments of the capping metal ring 91 to the length of one of the second sidewalls SW2 of the semiconductor die 700 (i.e., the second length L2) may be in a range from 0.8500 to 0.9948.

Generally, a large value for the ratio of the length of each first bar segment of the capping metal ring 91 to the first length L1 and/or a large value for the ratio of the length of each second bar segment of the capping metal ring 91 to the second length L2 increase the total area of the corner regions CR, and decreases the size of the device region 100 of the semiconductor die 700. Thus, it is preferred that the ratio of the length of each first bar segment of the capping metal ring 91 to the first length L1 and/or the ratio of the length of each second bar segment of the capping metal ring 91 to the second length L2 be less than 0.9948. However, a small value for the ratio of the length of each first bar segment of the capping metal ring 91 to the first length L1 and/or a small value for the ratio of the length of each second bar segment of the capping metal ring 91 to the second length L2 decrease the lateral distance between the capping metal ring 91 and the corner edges CE of the semiconductor die 700, and increase the mechanical stress generated by thermal mismatch between the capping metal ring 91 and a molding compound die frame to be subsequently formed. Thus, it is preferred that the ratio of the length of each first bar segment of the capping metal ring 91 to the first length L1 and/or the ratio of the length of each second bar segment of the capping metal ring 91 to the second length L2 be greater than 0.8500.

In one embodiment, at least one metallic bar structure 95 may be optionally formed concurrently with formation of the capping metal ring 91 directly on the topmost surface of the outer peripheral metal stack ring 65. In this embodiment, at least one discrete line trench may be formed through the first passivation dielectric layer 81 along a direction that is parallel to a sidewall of the semiconductor die 700, and the at least one first metallic material may be deposited in the at least one discrete line trench. A patterned portion of the at least one first metallic material comprises the at least one metallic bar structure 95. Each metallic bar structure 95 may have metal via portion that vertically extends through the first passivation dielectric layer 81, and a metal line portion that overlies the horizontal plane including the top surface of the first passivation dielectric layer 81.

Each metallic bar structure 95 may have a same material composition as the capping metal ring 91, and laterally extends parallel to a respective sidewall of the first sidewalls SW1 and the second sidewalls SW2 of the semiconductor die 700. The at least one metallic bar structure 95 is located in the peripheral region 300 between outer sidewalls of the capping metal ring and the sidewalls (SW1, SW2) of the semiconductor die 700. According to an aspect of the present disclosure, four corner regions of the at least one metallic bar structure 95 do not extend into the areas of the corner regions CR in a plan view. Further, each corner region CR may be free of any metallic material other than a respective single slanted bar segment of the capping metal ring 91.

In one embodiment, the width of each metallic bar structure 95, as measured between an inner sidewall and an outer sidewall of the metal line portion, may be in a range from 3.2 microns to 7.2 microns. The width of the metal via portion may be less than the width of the metal line portion of a respective metallic bar structure 95. According to an aspect of the present disclosure, the width of each metallic bar structure 95 is selected to ensure that each metallic bar structure 95 provides sufficient protection against diffusion of impurities and hydrogen atoms. Thus, a width greater than 3.2 micron is preferred for each metallic bar structure 95. Further, the width of each metallic bar structure 95 is selected to minimize adverse stress effects due to thermal expansion of the respective metallic bar structure 95. Thus, a width less than 7.2 microns is preferred for each metallic bar structure 95.

Optionally, a spacer metal ring 92 may be formed inside the area of the capping metal ring 91 above a horizontal plane including the top surface of the first passivation dielectric layer 81. In this embodiment, the at least one first metallic material may be patterned such that an annular remaining portion of the at least one first metallic material overlies the areas of the inner metal stack structures 62. The annular remaining portion of the at least one first metallic material constitutes a lower portion 92A of the spacer metal ring 92. As discussed above, the inner metal stack structures 62 may be laterally spaced apart from one another with openings between each laterally neighboring pair therea-mongst. The lower portion 92A of the spacer metal ring 92 is formed as a unitary structure that laterally encloses the entirety of the device region 100 of the semiconductor die 700.

At least one second passivation dielectric layer 82 may be formed over the first passivation dielectric layer 81, the capping metal ring 91, and the at least one metallic bar structure 95. In one embodiment, the at least one second passivation dielectric layer 82 may comprise a lower second passivation dielectric layer 82A that covers the top surfaces of the capping metal ring 91, and the at least one metallic bar structure 95. An annular line trench may be formed over the lower portion 92A of the spacer metal ring 92. At least one second metallic material may be deposited into the annular line trench and above the lower second passivation dielectric layer 82A, and may be patterned to form an upper portion 92B of the spacer metal ring 92. The upper portion 92B of the spacer metal ring 92 may comprise a metal via portion that vertically extends through an upper portion of the lower second passivation dielectric layer 82A, and a ring-shaped metal plate portion that overlies the horizontal plane includ-ing the top surface of the lower second passivation dielectric layer 82A.

The at least one second metallic material may be the same as, or may be different from, the at least one first metallic material. In one embodiment, the upper portion of the spacer metal ring 92 may comprise a material selected from copper, an aluminum-copper alloy, and an aluminum-copper-silicon alloy. In one embodiment, the upper portion of the spacer metal ring 92 may comprise an aluminum-based material including aluminum at an atomic percentage greater than 90%. In one embodiment, the at least one second metallic material may have a different material composition than the at least one first metallic material.

The combination of the lower portion 92A of the spacer metal ring 92 and the upper portion 92B of the spacer metal ring 92 constitutes the spacer metal ring 92. The vertical extent of the spacer metal ring 92 is vertically offset relative to the vertical extent of the capping metal ring 91. For example, the bottommost surface of the spacer metal ring 92 may be located above the horizontal plane including the bottommost surface of the capping metal ring 91, and may be located below the horizontal plane including the topmost surface of the capping metal ring 91. The topmost surface of the spacer metal ring 92 may be located above the horizontal plane including the topmost surface of the capping metal ring 91. In one embodiment, the lower portion 92A of the spacer metal ring 92 has a same material composition as the capping metal ring 91 and comprises a horizontal surface located within a horizontal plane including a topmost sur-face of the capping metal ring 91; and the upper portion 92B of the spacer metal ring 92 has a different material compo-sition than the capping metal ring 91.

An upper second passivation dielectric layer 82B may be formed above the lower second passivation dielectric layer 82A and the spacer metal ring 92. The combination of the lower second passivation dielectric layer 82A and the upper second passivation dielectric layer 82B constitutes a second passivation dielectric layer 82. Subsequently, a third passi-vation dielectric layer 83 may be formed above the second passivation dielectric layer 82. In one embodiment, the third passivation dielectric layer 83 may comprise, and/or may consist essentially of, silicon nitride. In one embodiment, the first passivation dielectric layer 81, the lower second passi-vation dielectric layer 82A, the upper second passivation dielectric layer 82B, and the third passivation dielectric layer 83 may comprise silicon nitride, silicon carbide nitride, a polymer material (such as polyimide or a resin), undoped silicate glass, or a doped silicate glass. In one embodiment, one, a plurality, and/or each of the first passivation dielectric layer 81, the lower second passivation dielectric layer 82A, the upper second passivation dielectric layer 82B, and the third passivation dielectric layer 83 may comprise, and/or may consist essentially of, silicon nitride, silicon carbide nitride, or a polymer material (such as polyimide or a resin). In one embodiment, each of the first passivation dielectric layer 81, the lower second passivation dielectric layer 82A, the upper second passivation dielectric layer 82B, and the third passivation dielectric layer 83 may have a thickness in a range from 0.5 micron to 5 microns, such as from 1 micron to 3 microns, although lesser and greater thicknesses may also be used.

In one embodiment, the at least one passivation dielectric layer 80 comprises a first passivation dielectric layer 81 contacting a topmost surface of the dielectric material layers 70; at least one second passivation dielectric layer 82 contacting a topmost surface of the capping metal ring 91; and a third passivation dielectric layer 83 overlying, and vertically spaced from, the capping metal ring 91.

In one embodiment, a peripheral region of the at least one passivation dielectric layer 80 located between outer side-walls of the capping metal ring 91 and sidewalls of the semiconductor die 700 may have formed therein at least one metallic bar structure 95 having a same material composi-tion as the capping metal ring 91 and laterally extending parallel to a respective sidewall of the first sidewalls SW1 and the second sidewalls SW2 of the semiconductor die 700. In one embodiment, the entirety of a region of the at least one passivation dielectric layer 80 located between outer sidewalls of the capping metal ring 91 and a combination of the first sidewalls SW1 and the second sidewalls SW2 of the semiconductor die 700 does not have formed therein any metallic material. Thus, any metallic bar structure 95 is located outside the area of each region of the at least one passivation dielectric layer 80 located between outer side-walls of the capping metal ring 91 and the combination of the first sidewalls SW1 and the second sidewalls SW2 of the semiconductor die 700.

In one embodiment, the dielectric material layers 70 overlie the semiconductor substrate 8 and have formed therein metal interconnect structures 76, and the edge ring seal structure 61 vertically extends from the semiconductor substrate 8 to a bottom surface of the at least one passivation dielectric layer 80.

Front bonding structures 98 may be formed in the area of the device region 100 through the passivation dielectric layers 80. Subsequently, the backside of the semiconductor substrate 8 may be thinned from the backside, and the backside insulating layer 16 may be deposited on the recessed backside surface of the semiconductor substrate 8. Backside bonding structures 28 may be formed on the backside surface of the TSV structures 24. Subsequently, the semiconductor wafer, the dielectric material layers 70, and the passivation dielectric layers 80 may be diced to form a plurality of semiconductor dies 700.

Generally, the semiconductor die 700 may comprise a semiconductor substrate 8; dielectric material layers 70 overlying the semiconductor substrate 8; an edge ring seal structure 61 laterally enclosing the dielectric material layers 70 without any lateral opening therethrough; at least one passivation dielectric layer 80 overlying the dielectric material layers 70; and a capping metal ring 91 contacting a top surface segment of the edge ring seal structure 61 and laterally surrounding a lower portion 92A of the at least one passivation dielectric layer 80. The edge ring seal structure 61 comprises two lengthwise segments that are parallel to first sidewalls SW1 of the semiconductor die 700, two widthwise segments that are parallel to second sidewalls SW2 of the semiconductor die 700, and four slanted corner segments SCS that connect a respective one of the two lengthwise segments and a respective one the two widthwise segments. Each corner region of the at least one passivation dielectric layer 80 located between a vertical plane VP including an inner sidewall of the four slanted corner segments SCS of the edge ring seal structure 61 and a vertical line containing a most proximal corner edge CE of the semiconductor die 700 is free of any metallic material other than a respective single slanted bar segment of the capping metal ring 91.

In one embodiment, the edge ring seal structure 61 may comprise four additional slanted corner segments located outside of the four slanted corner segments SCS having a respective areal overlap with the capping metal ring 91. In this embodiment, the four slanted corner segments SCS having an areal overlap with the capping metal ring 91 are herein referred to as inner slanted corner segments, and the four additional slanted corner segments located outside the inner slanted corner segments are herein referred to as outer slanted corner segments of the edge ring seal structure 61. The intermediate metal stack structures 63 may be located between a respective pair of an inner slanted corner segment and an outer slanted corner segment.

In one embodiment, the semiconductor die 700 may comprise a semiconductor substrate 8; dielectric material layers 70 overlying the semiconductor substrate 8; an edge ring seal structure 61 laterally enclosing the dielectric material layers 70 without any lateral opening therethrough; at least one passivation dielectric layer 80 overlying the dielectric material layers 70; a capping metal ring 91 contacting a top surface segment of the edge ring seal structure 61 and laterally surrounding a lower portion 92A of the at least one passivation dielectric layer 80; and a spacer metal ring 92 formed within the at least one passivation dielectric layer 80 and located inside the capping metal ring 91 and having a topmost surface that is located above a horizontal plane including a topmost surface of the capping metal ring 91.

Figure 2A:
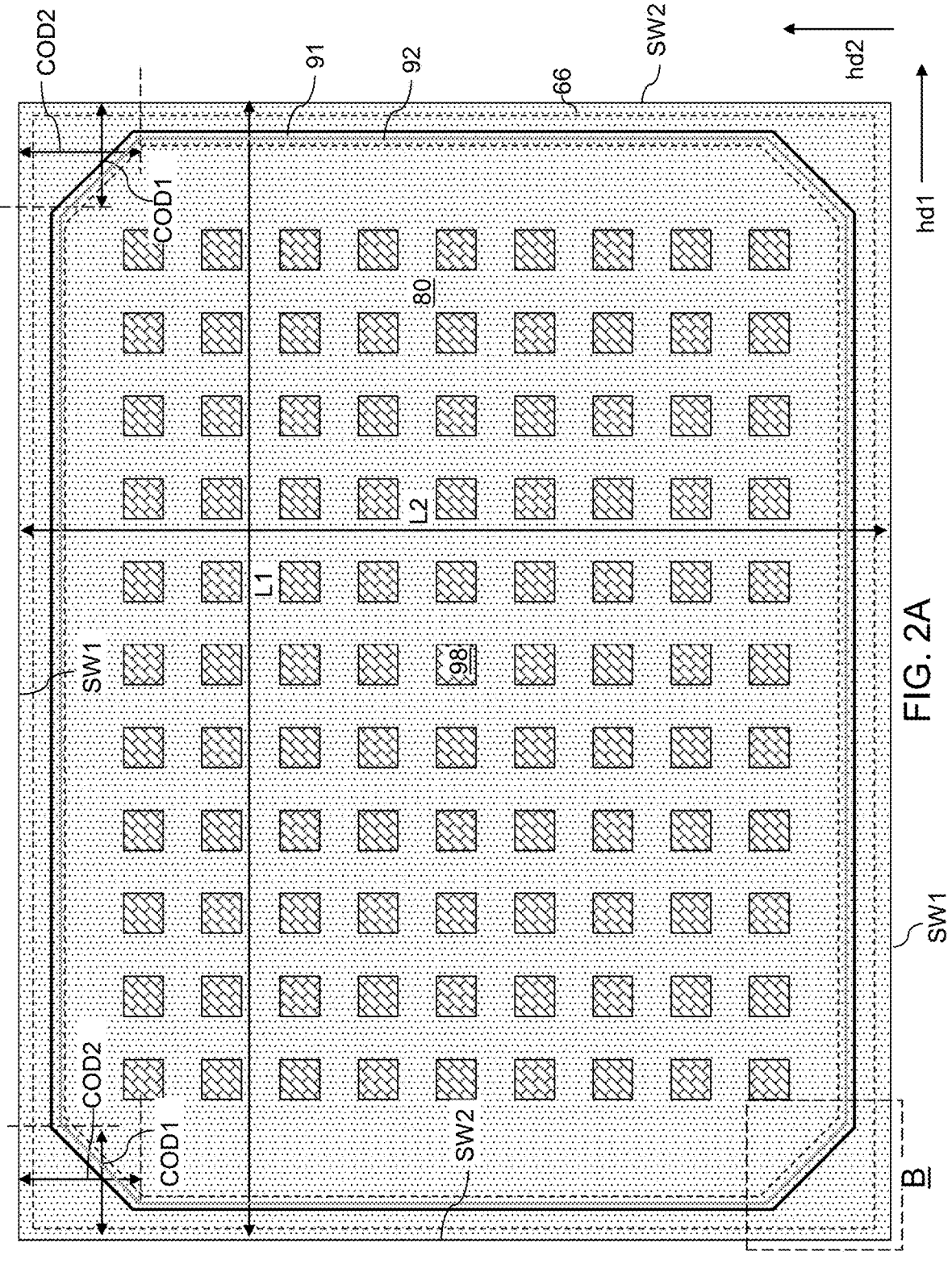
FIG. 2A is a partial see-through top-down view of the embodiment semiconductor die of FIG. 1 in instances in which the embodiment semiconductor die is in a second configuration according to an embodiment of the present disclosure.
Figure 2B:
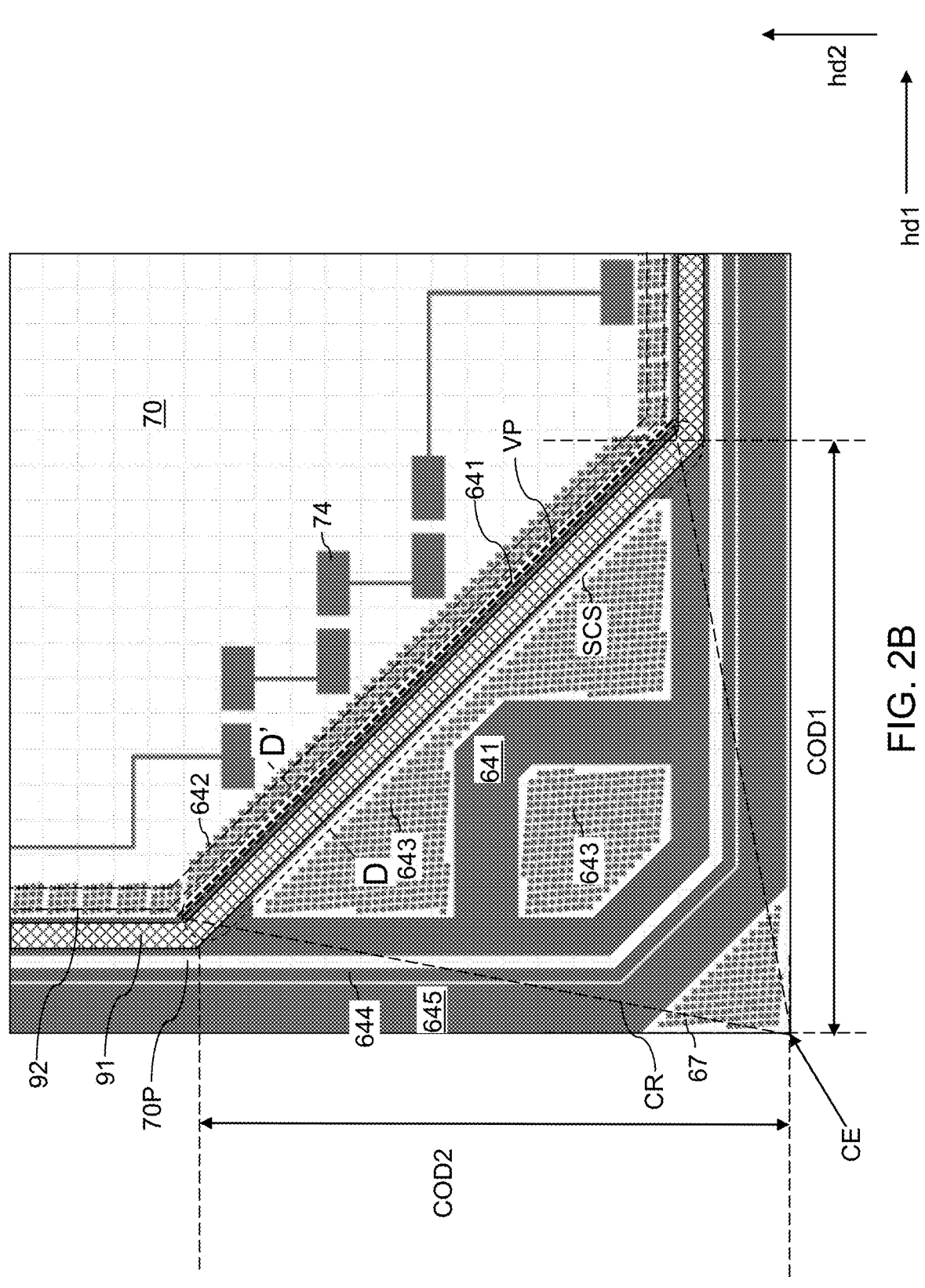
FIG. 2B is a magnified view of region B of FIG. 2A.

FIG. 2A is a partial see-through top-down view of the embodiment semiconductor die of FIG. 1 in instances in which the embodiment semiconductor die is in a second configuration according to an embodiment of the present disclosure. FIG. 2B is a magnified view of region B of FIG. 2A.

Referring to FIGS. 2A and 2B, the second configuration of the semiconductor die 700 may be derived from the first configuration of the semiconductor die 700 illustrated in FIGS. 1A-1E or any of the alternative configurations to be described below by omitting formation of the at least one metallic bar structure 95.

Figure 3A:
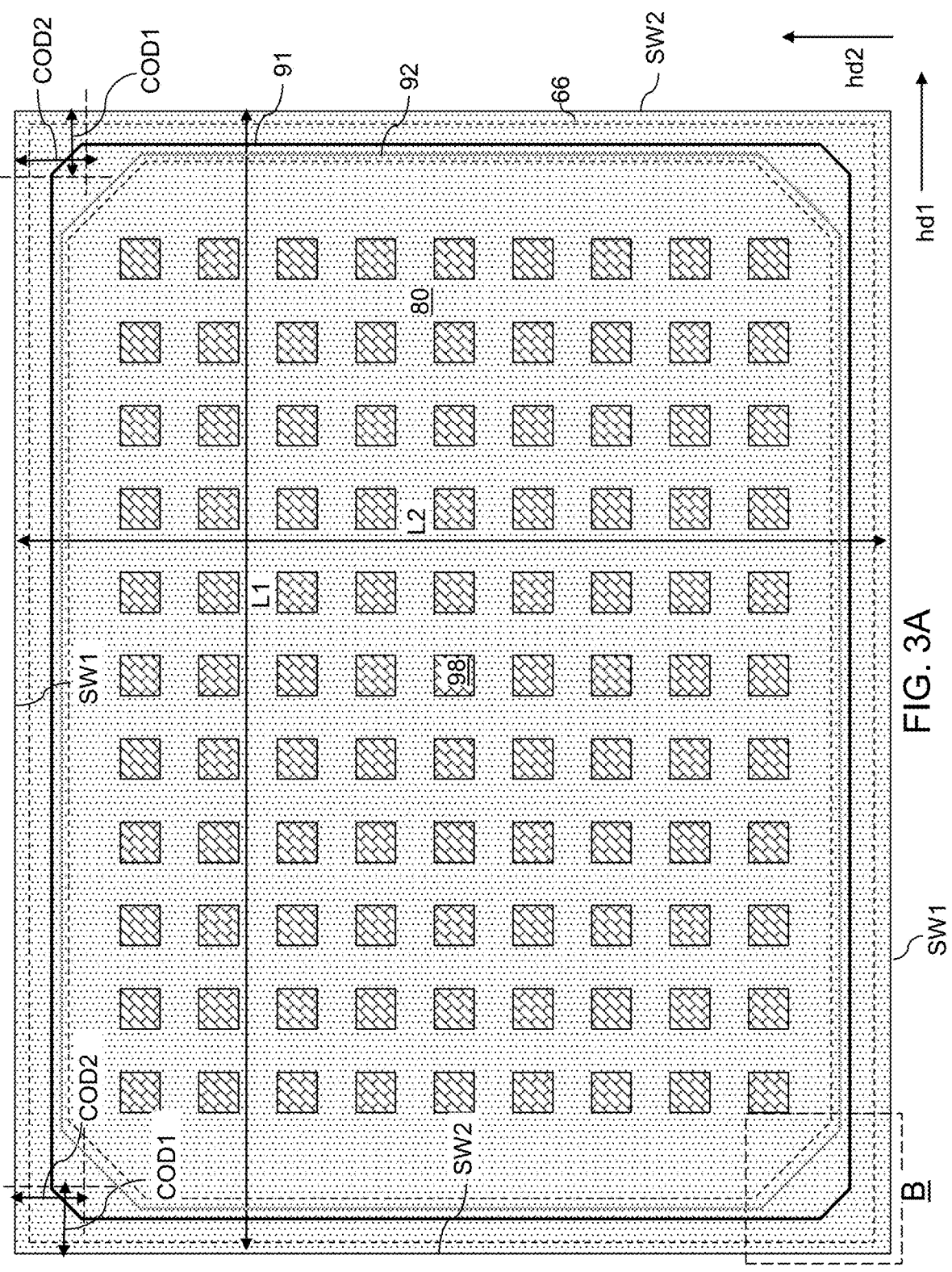
FIG. 3A is a partial see-through top-down view of the embodiment semiconductor die of FIG. 1 in instances in which the embodiment semiconductor die is in a third configuration according to an embodiment of the present disclosure.
Figure 3B:
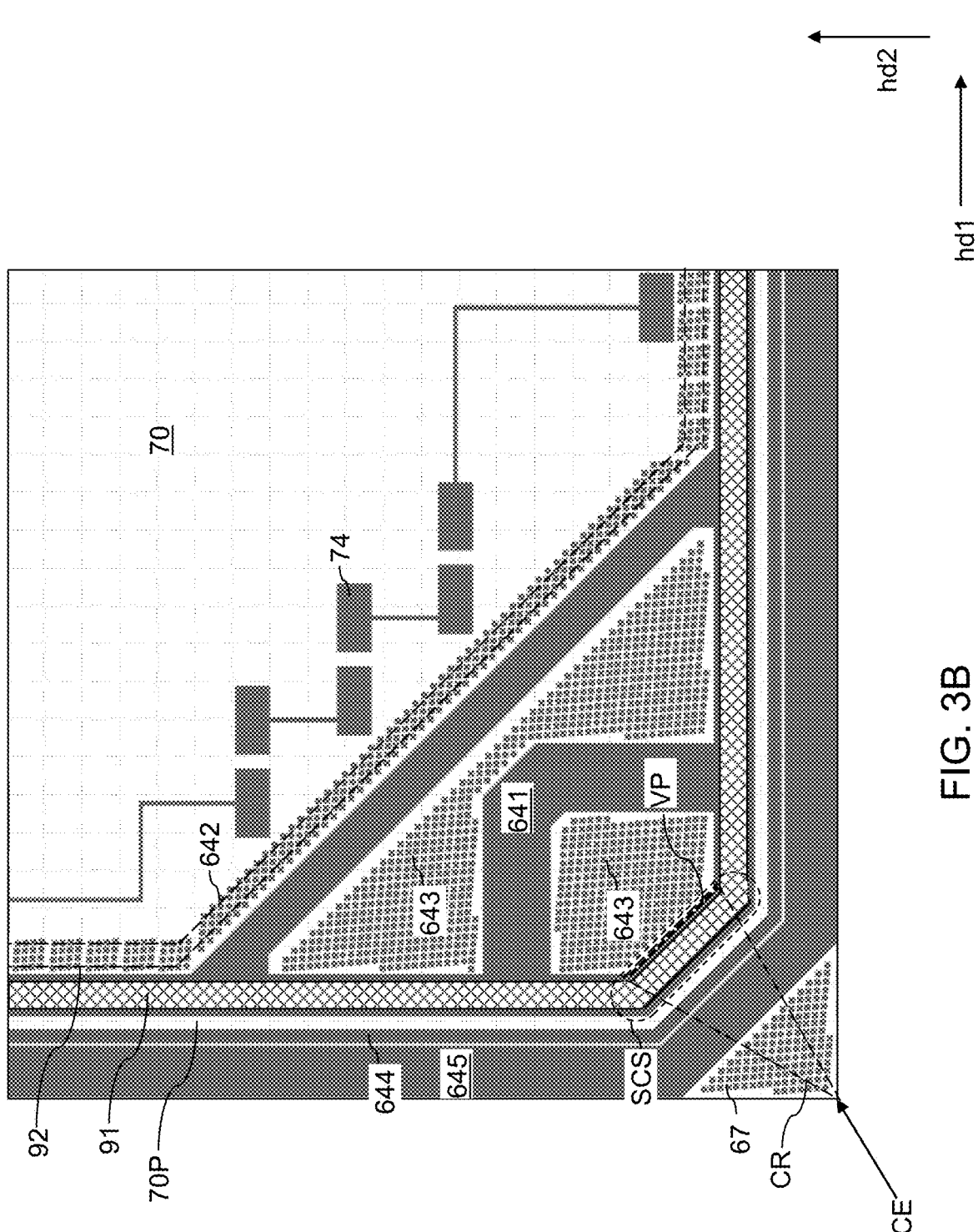
FIG. 3B is a magnified view of region B of FIG. 3A.

FIG. 3A is a partial see-through top-down view of the embodiment semiconductor die of FIG. 1 in case the embodiment semiconductor die is in a third configuration according to an embodiment of the present disclosure. FIG. 3B is a magnified view of region B of FIG. 3A.

Referring to FIGS. 3A and 3B, the third configuration of the semiconductor die 700 may be derived from the first configuration of the semiconductor die 700 illustrated in FIGS. 1A-1E, from the second configuration of the semiconductor die 700 illustrated in FIGS. 2A and 2B, or from any of the additional alternative configurations to be described below by forming the capping metal ring 91 such that the capping metal ring 91 overlies outer slanted corner segments SCS of the edge ring seal structure 61 and does not overlie inner slanted corner segments of the edge ring seal structure 61.

In the third configuration of the semiconductor die 700, the edge ring seal structure 61 comprises two lengthwise segments that are parallel to first sidewalls SW1 of the semiconductor die 700, two widthwise segments that are parallel to second sidewalls SW2 of the semiconductor die 700, and four slanted corner segments SCS (which are four outer slanted corner segments) that connect a respective one of the two lengthwise segments and a respective one the two widthwise segments. Each corner region of the at least one passivation dielectric layer 80 located between a vertical plane VP including an inner sidewall of the four slanted corner segments SCS of the edge ring seal structure 61 and a vertical line containing a most proximal corner edge CE of the semiconductor die 700 is free of any metallic material other than a respective single slanted bar segment of the capping metal ring 91. The capping metal ring 91 does not overlie any of the inner slanted corner segments of the edge ring seal structure 61.

Figure 4A:
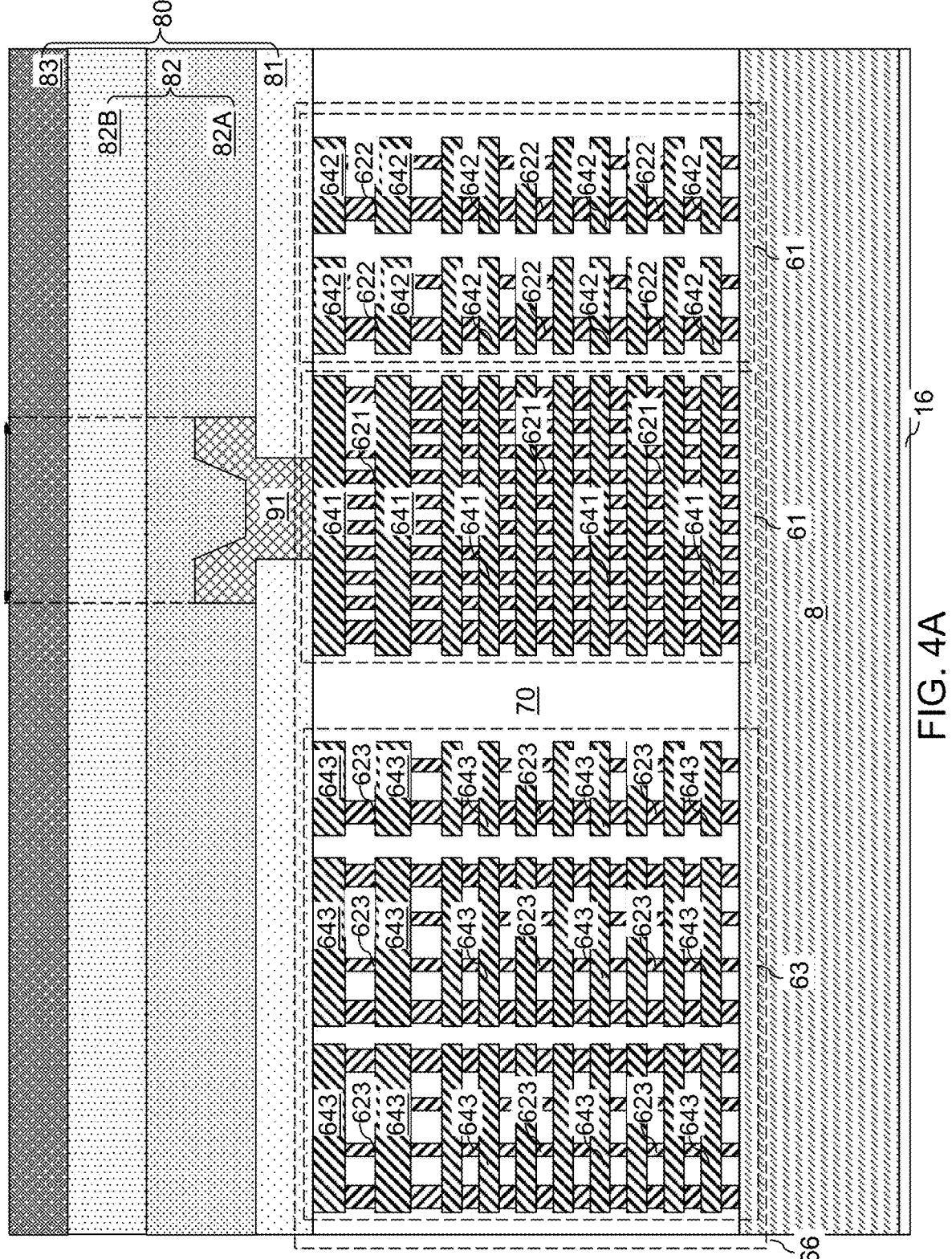
FIG. 4A is a vertical cross-sectional view of a first region of the embodiment semiconductor die in instances in which the embodiment semiconductor die is in a fourth configuration. The vertical cut plane of FIG. 4A corresponds to the vertical cut plane D-D' of FIG. 1C.
Figure 4B:
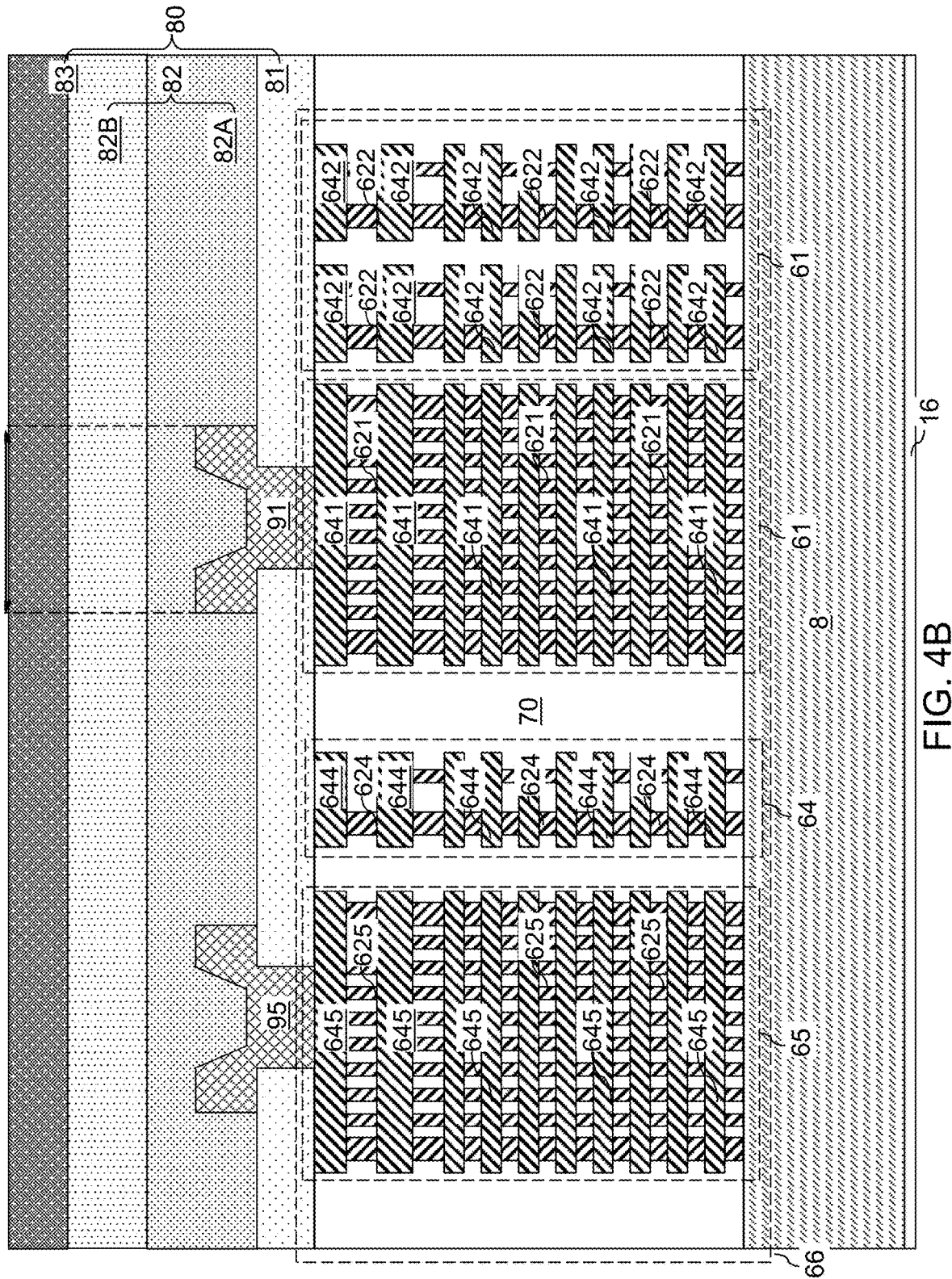
FIG. 4B is a vertical cross-sectional view of a second region of the embodiment semiconductor die in instances in which the embodiment semiconductor die is in the fourth configuration. The vertical cut plane of FIG. 4B corresponds to the vertical cut plane E-E' of FIG. 1C.

FIG. 4A is a vertical cross-sectional view of a first region of the embodiment semiconductor die in case the embodiment semiconductor die is in a fourth configuration. The vertical cut plane of FIG. 4A corresponds to the vertical cut plane D-D' of FIG. 1C. FIG. 4B is a vertical cross-sectional view of a second region of the embodiment semiconductor die in case the embodiment semiconductor die is in the fourth configuration. The vertical cut plane of FIG. 4B corresponds to the vertical cut plane E-E' of FIG. 1C.

Referring to FIGS. 4A and 4B, the fourth configuration of the semiconductor die 700 may be derived from any of the previously described configurations or from any of the alternative configurations to be described below by omitting formation of the spacer metal ring 92.

Figure 4C:
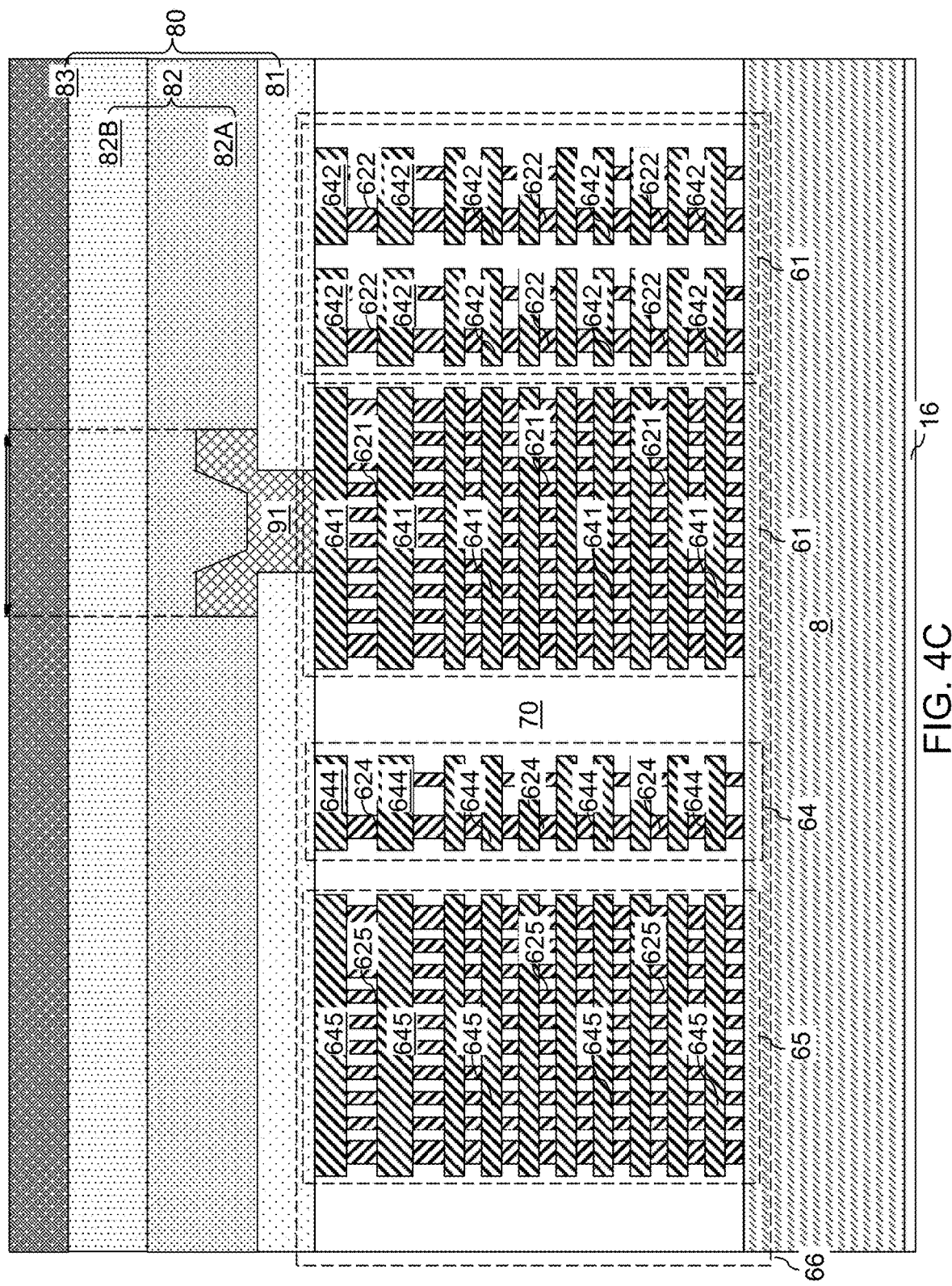
FIG. 4C is a vertical cross-sectional view of a region of the embodiment semiconductor die in instances in which the embodiment semiconductor die is in a fifth configuration. The vertical cut plane of FIG. 4C corresponds to the vertical cut plane E-E' of FIG. 1C.

FIG. 4C is a vertical cross-sectional view of a region of the embodiment semiconductor die in case the embodiment semiconductor die is in a fifth configuration. The vertical cut plane of FIG. 4C corresponds to the vertical cut plane E-E' of FIG. 1C.

Referring to FIG. 4C, an alternative configuration of the fourth configuration of the semiconductor die 700 may be derived from any of the previously described configurations or from any of the alternative configurations to be described below by omitting formation of the spacer metal ring 92 and by omitting formation of the at least one metallic bar structure 95.

Figure 5A:
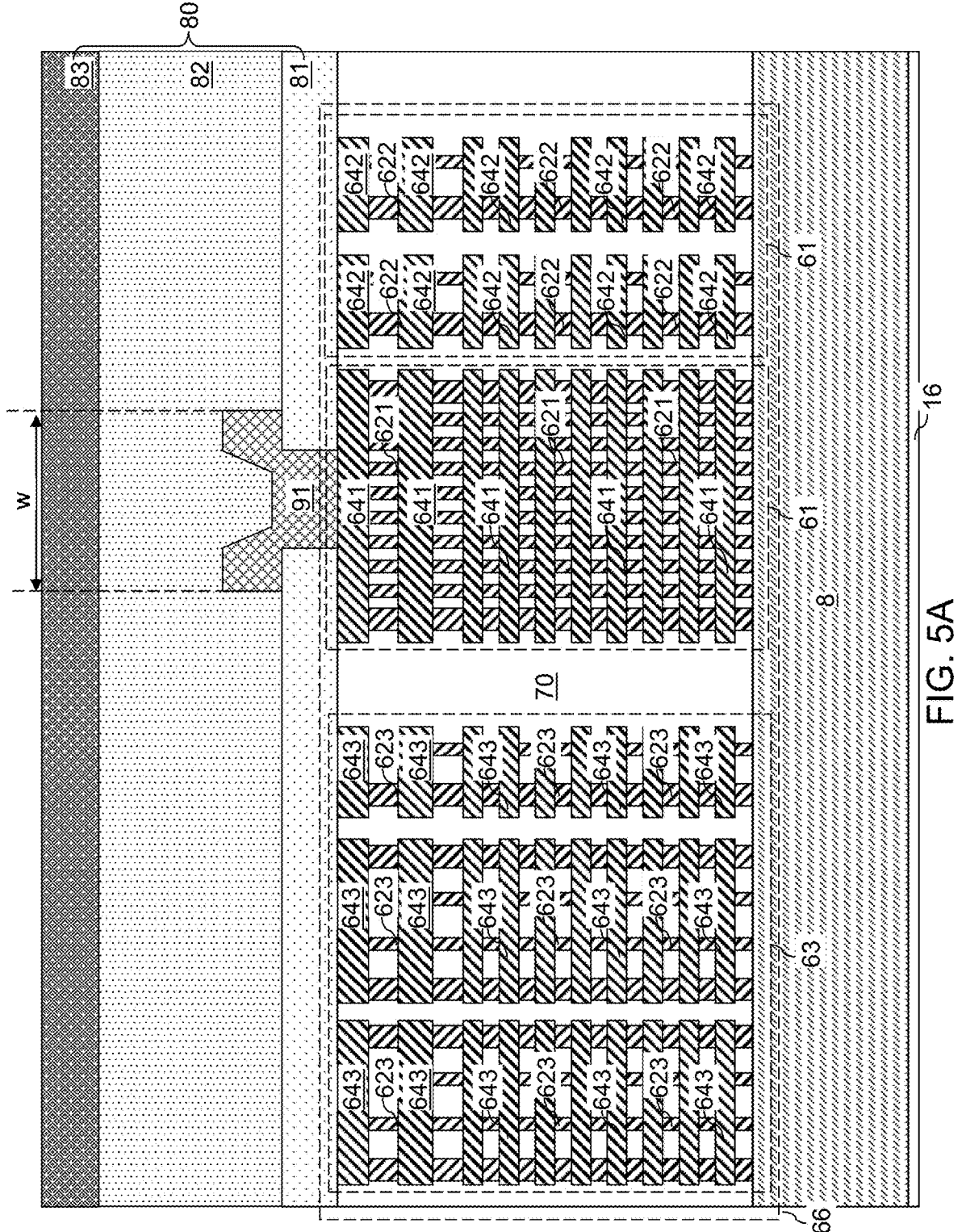
FIG. 5A is a vertical cross-sectional view of a first region of the embodiment semiconductor die in instances in which the embodiment semiconductor die is in a sixth configuration. The vertical cut plane of FIG. 5A corresponds to the vertical cut plane D-D' of FIG. 1C.
Figure 5B:
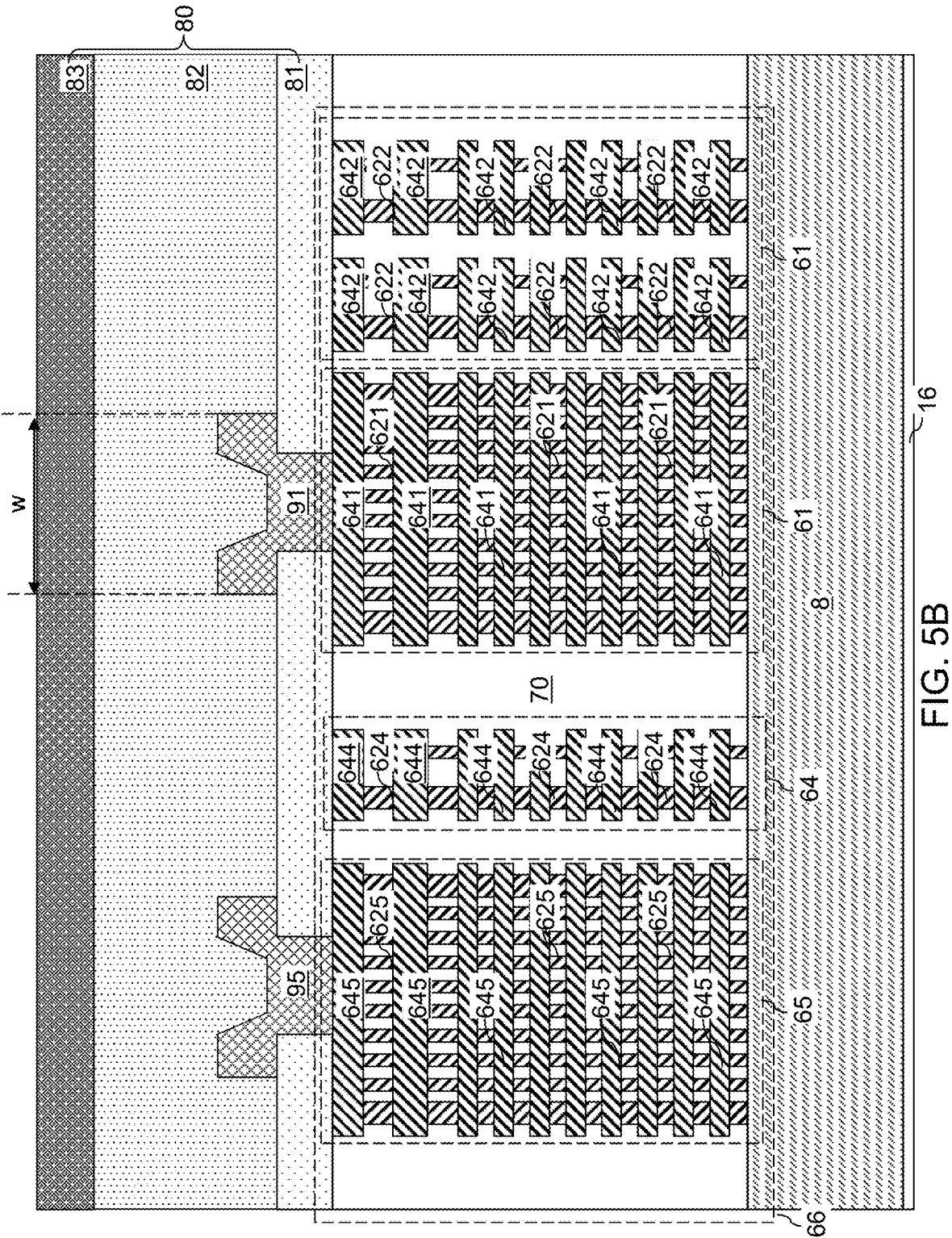
FIG. 5B is a vertical cross-sectional view of a second region of the embodiment semiconductor die in instances in which the embodiment semiconductor die is in the sixth configuration. The vertical cut plane of FIG. 5B corresponds to the vertical cut plane E-E' of FIG. 1C.

FIG. 5A is a vertical cross-sectional view of a first region of the embodiment semiconductor die in case the embodiment semiconductor die is in a sixth configuration. The vertical cut plane of FIG. 5A corresponds to the vertical cut plane D-D' of FIG. 1C. FIG. 5B is a vertical cross-sectional view of a second region of the embodiment semiconductor die in case the embodiment semiconductor die is in the sixth configuration. The vertical cut plane of FIG. 5B corresponds to the vertical cut plane E-E' of FIG. 1C.

Referring to FIGS. 5A and 5B, the fifth configuration of the semiconductor die 700 may be derived from the third configuration of the semiconductor die 700 illustrated in FIGS. 4A and 4B by using a single homogeneous passivation dielectric layer having a uniform material composition throughout for the second passivation dielectric layer 82.

Figure 5C:
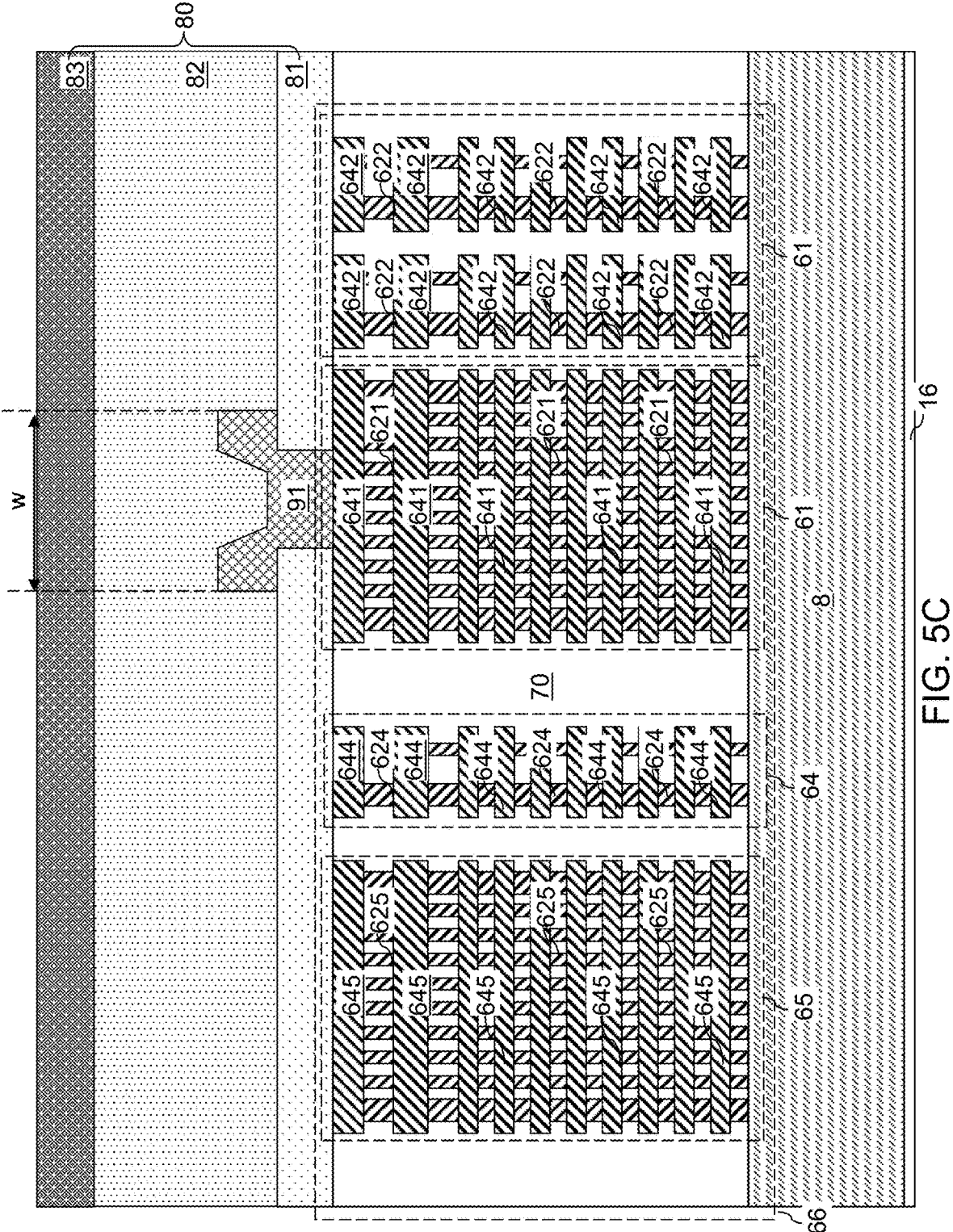
FIG. 5C is a vertical cross-sectional view of a region of the embodiment semiconductor die in instances in which the embodiment semiconductor die is in a seventh configuration. The vertical cut plane of FIG. 5C corresponds to the vertical cut plane E-E' of FIG. 1C.

FIG. 5C is a vertical cross-sectional view of a region of the embodiment semiconductor die in case the embodiment semiconductor die is in a seventh configuration. The vertical cut plane of FIG. 5C corresponds to the vertical cut plane E-E' of FIG. 1C.

Referring to FIG. 5C, the sixth configuration of the semiconductor die 700 may be derived from the fourth configuration of the semiconductor die 700 illustrated in FIG. 4C by using a single homogeneous passivation dielectric layer having a uniform material composition throughout for the second passivation dielectric layer 82.

Figure 6A:
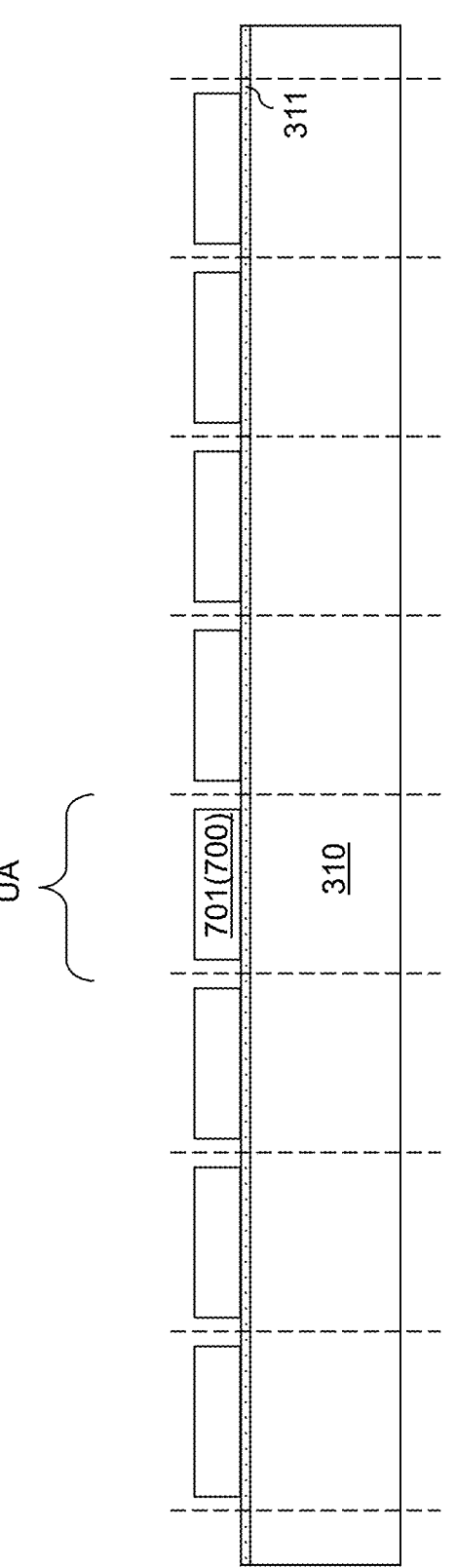
FIG. 6A is a vertical cross-sectional view of an embodiment structure including a carrier wafer and a plurality of first semiconductor dies attached to the carrier wafer according to an embodiment of the present disclosure.
Figure 6B:
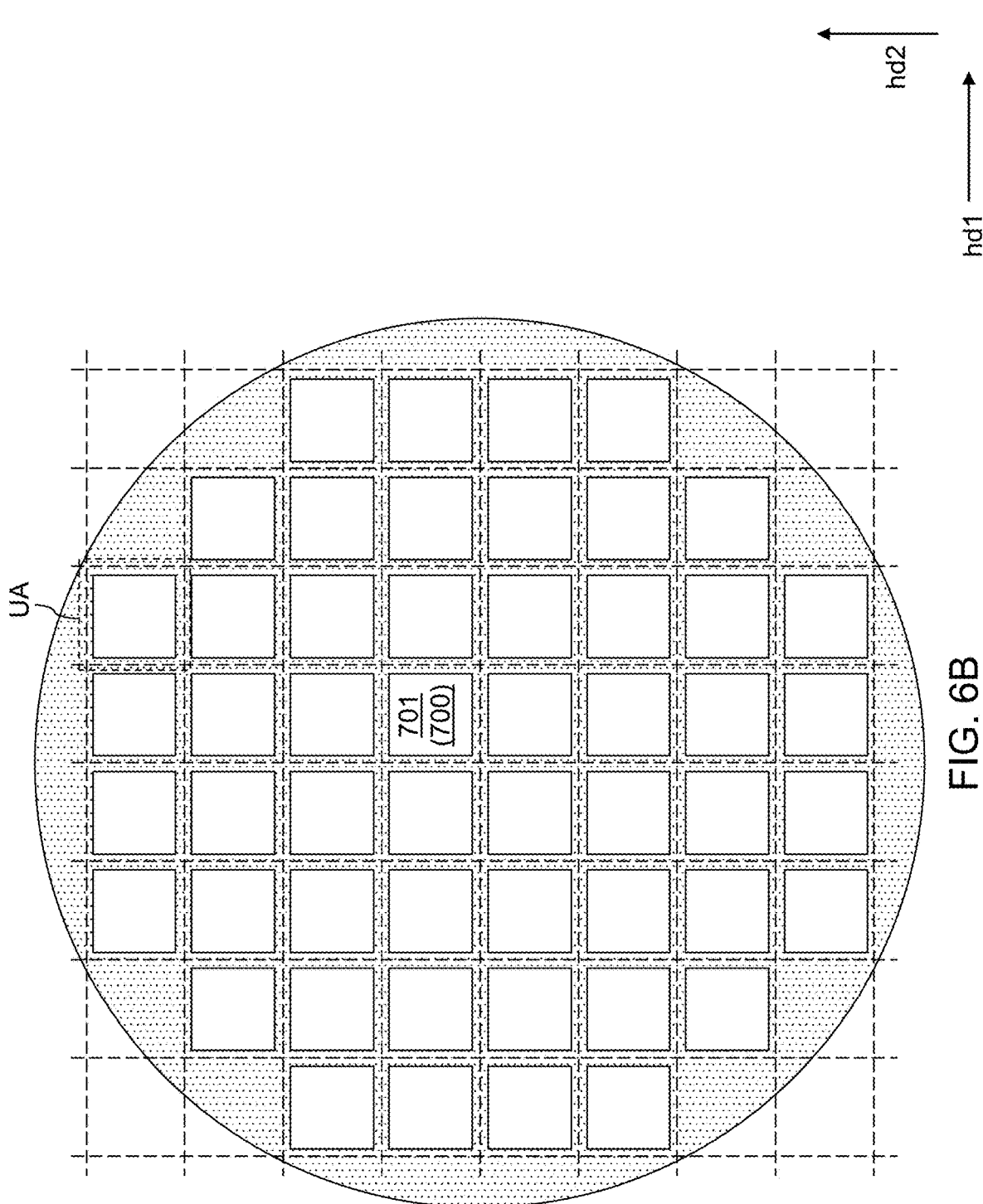
FIG. 6B is a top-down view of the embodiment structure of FIG. 6A. The vertical plane A-A' is the cut plane of the vertical cross-sectional view of FIG. 6A.

FIG. 6A is a vertical cross-sectional view of an intermediate structure including a carrier wafer and a plurality of first semiconductor dies 701 attached to the carrier wafer according to an embodiment of the present disclosure. FIG. 6B is a top-down view of the embodiment intermediate structure of FIG. 6A. The vertical plane VP A-A' is the cut plane of the vertical cross-sectional view of FIG. 6A.

Referring to FIGS. 6A and 6B, a carrier wafer 310 is provided. The carrier wafer 310 may comprise a semiconductor wafer, an insulator layer, a conductive wafer, or a composite wafer provided that the carrier wafer 310 provides sufficient mechanical strength to structures to be subsequently formed thereupon. In one embodiment, the carrier wafer 310 may comprise a transparent wafer such as a glass wafer or a sapphire wafer. The thickness of the carrier wafer 310 may be in a range from 500 microns to 2 mm, although lesser and greater thicknesses may also be used.

A light-to-heat conversion (LTHC) layer 311 may be formed on a top surface of the carrier wafer 310. The LTHC layer 311 comprises a material that absorbs light and convert it into heat. A commercially available material may be suitable for the LTHC layer 311. Generally, the LTHC layer 311 may be deposited by physical vapor deposition, chemical vapor deposition, or atomic layer deposition, and may have a thickness in a range from 10 nm to 1,000 nm, although lesser and greater thicknesses may also be used.

The area of the carrier wafer 310 may be include a two-dimensional array of unit areas UA in which a two-dimensional array of fan-out packages are to be subsequently formed. The two-dimensional array of unit areas UA may be arranged as a two-dimensional periodic array such as a two-dimensional rectangular array, or may be arranged as a two-dimensional irregular array in which the unit areas UA are repeated in a non-periodic manner. While the drawings of the present disclosure illustrate two-dimensional periodic arrays of unit areas UA, embodiments are expressly contemplated herein in which the unit areas UA are arranged as a non-periodic two-dimensional array.

A pick-and-placement tool including at least one camera and a pattern recognition program may be used to dispose first semiconductor dies 701 on the top surface of the LTHC layer 311. Each of the first semiconductor dies 701 may be any of the semiconductor dies 700 described with reference to FIGS. 1A-5C. Generally, each first semiconductor die 701 may be placed such that the front bonding structures 98 face up or the backside bonding structures 28 face up. While the present disclosure is described using an embodiment in which a single first semiconductor die 701 is placed within each unit area UA, embodiments are expressly contemplated herein in which a plurality of first semiconductor dies 701 are placed in each unit area UA.

Figure 7:
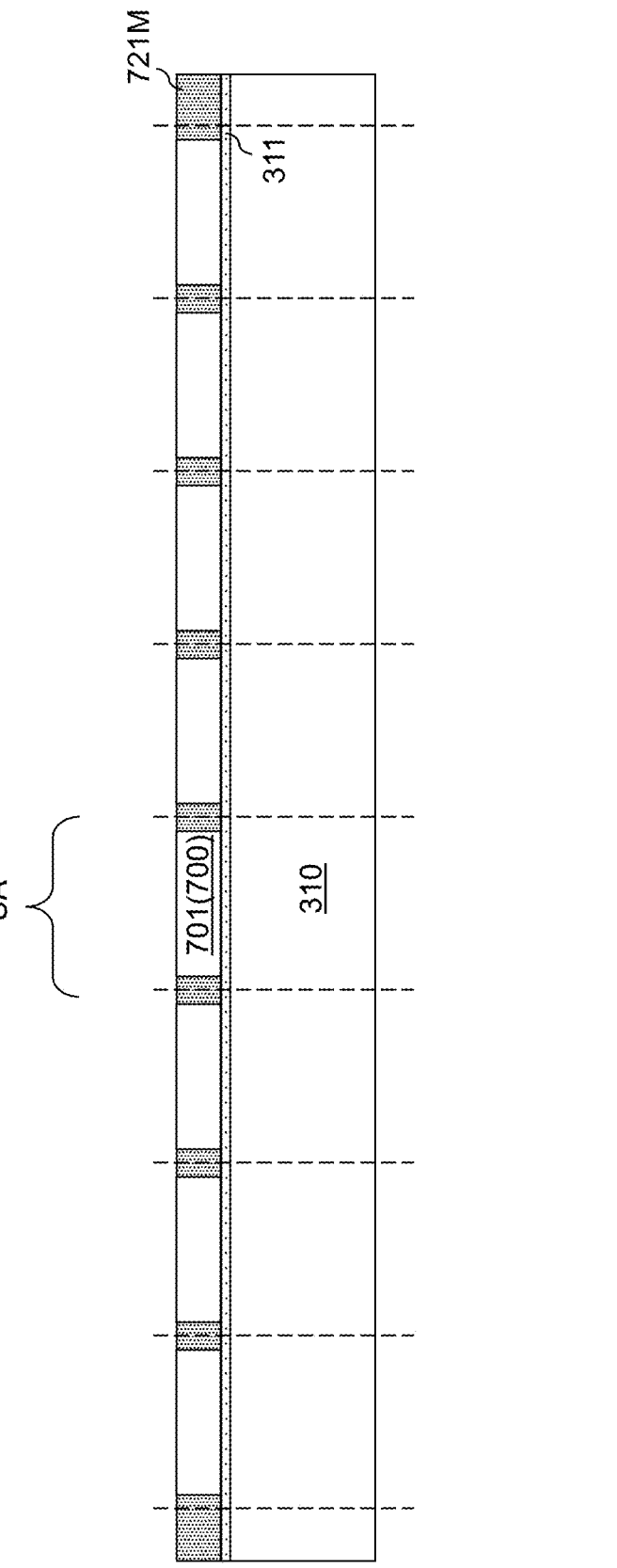
FIG. 7 is a vertical cross-sectional view of the embodiment structure after formation of a first molding compound matrix according to an embodiment of the present disclosure.

Referring to FIG. 7, in the intermediate structure, a molding compound (MC) may be applied to the gaps of the first semiconductor dies 701. The MC includes an epoxy-containing compound that may be hardened (i.e., cured) to provide a dielectric material portion having sufficient stiffness and mechanical strength. The MC may include epoxy resin, hardener, silica (as a filler material), and other additives. The MC may be provided in a liquid form or in a solid form depending on the viscosity and flowability. Liquid MC typically provides better handling, good flowability, less voids, better fill, and less flow marks. Solid MC typically provides less cure shrinkage, better stand-off, and less die drift. A high filler content (such as 85% in weight) within an MC may shorten the time in mold, lower the mold shrinkage, and reduce the mold warpage. Uniform filler size distribution in the MC may reduce flow marks, and may enhance flowability.

The MC may be cured at a curing temperature to form a first molding compound matrix 721M, which is also referred to as a first MC matrix 721M. The first MC matrix 721M laterally encloses each of the first semiconductor dies 701. The first MC matrix 721M may be a continuous material layer that extends across the entirety of the area of a reconstituted wafer overlying the carrier wafer 310. Excess portions of the first MC matrix 721M may be removed from above the horizontal plane including the top surfaces of the first semiconductor dies 701 by a planarization process, which may use chemical mechanical planarization (CMP). Top surfaces of the first semiconductor dies 701 may be physically exposed after performing the planarization process. The top surfaces of the first semiconductor dies 701 may be located within a horizontal plane including the top surface of the first MC matrix 721M.

The first MC matrix 721M includes a plurality of first molding compound (MC) die frames located within a respective unit area UA. Each first MC die frame corresponds to a portion of the first MC matrix 721M located within a unit area UA, i.e., an area of a single interposer to be subsequently formed. In other words, each portion of the first MC matrix 721M that is located within a respective unit area UA constitutes a first MC die frame. The first MC die frames are laterally adjoined to one another to provide a unitary structure, which is the first MC matrix 721M. The first sidewalls SW1 and the second sidewalls SW2 of each first semiconductor die 701 contact the first molding compound matrix 721M.

Figure 8:
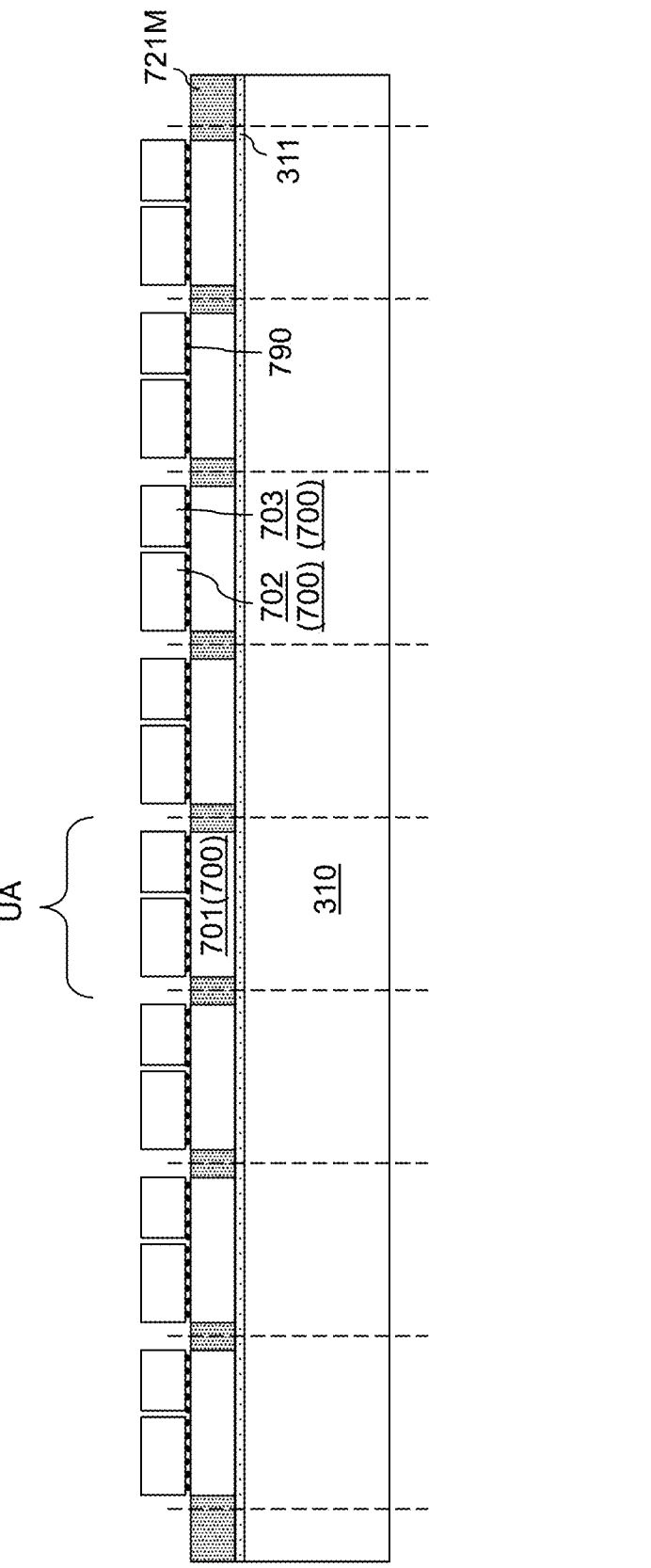
FIG. 8 is a vertical cross-sectional view of the structure after attaching a set of a second semiconductor die and a third semiconductor die to each first semiconductor die according to an embodiment of the present disclosure.

Referring to FIG. 8, in an intermediate structure, a set of at least one semiconductor die may be attached to each first semiconductor die 701. For example, a set of a second semiconductor die 702 and a third semiconductor die 703 may be attached to each first semiconductor die 701. Generally, at least a second semiconductor die 702 may be bonded to each first semiconductor die 701. Each second semiconductor die 702 may have any of the configurations of the semiconductor die 700 described with reference to FIGS. 1A-5C. Each second semiconductor die 702 may comprise a respective array of bonding structures, and an array of solder material portions 790 may be used to bond the second semiconductor dies 702 to the front bonding structures 98 or to the backside bonding structures 28 of the first semiconductor dies 701. Likewise, at least a third semiconductor die 703 may be optionally bonded to each first semiconductor die 701. Each third semiconductor die 703 may have any of the configurations of the semiconductor die 700 described with reference to FIGS. 1A-5C. Each third semiconductor die 703 may comprise a respective array of bonding structures, and an array of solder material portions 790 may be used to bond the third semiconductor dies 703 to additional front bonding structures 98 or to additional backside bonding structures 28 of the first semiconductor dies 701.

While the present disclosure is described using an embodiment in which a second semiconductor die 702 and a third semiconductor die 703 are attached to each first semiconductor die 701, embodiments are expressly contemplated herein in which a single semiconductor die or three or more semiconductor dies are attached to the first semiconductor die 701 (or a plurality of first semiconductor dies) in each unit area UA.

Figure 9:
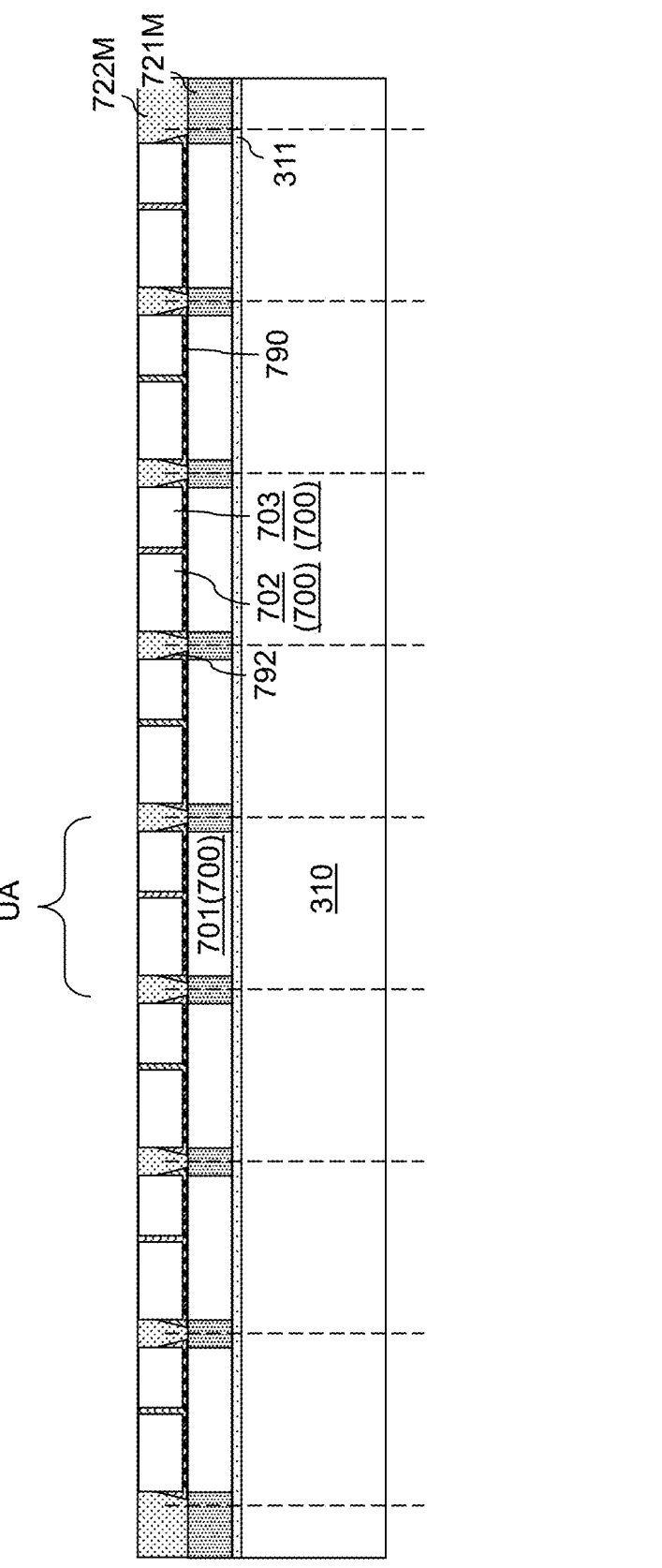
FIG. 9 is a vertical cross-sectional view of the embodiment structure after formation of a second molding compound matrix according to an embodiment of the present disclosure.

Referring to FIG. 9, an underfill material may be applied to each gap between each first semiconductor die 701 and a respective overlying set of a second semiconductor die 702 and an optional third semiconductor die 703. An underfill material portion 792 may be formed within each unit area UA between a first semiconductor die 701 (or a plurality of first semiconductor dies) and a set of at least one overlying semiconductor die (such as a second semiconductor die 702 and a third semiconductor die 703).

An additional molding compound (MC) may be applied to the gaps of the second semiconductor dies 702 and the optional third semiconductor dies 703. The additional molding compound may be cured at a curing temperature to form a second molding compound matrix 722M, which is also referred to as a second MC matrix 722M. The second MC matrix 722M laterally encloses each of the second semiconductor dies 702 and the third semiconductor dies 703. The second MC matrix 722M may be a continuous material layer that extends across the entirety of the area of a reconstituted wafer overlying the carrier wafer 310. Excess portions of the second MC matrix 722M may be removed from above the horizontal plane including the top surfaces of the second semiconductor dies 702 and the third semiconductor dies 703 by a planarization process, which may use chemical mechanical planarization (CMP). Top surfaces of the second semiconductor dies 702 and the third semiconductor dies 703 may be physically exposed after performing the planarization process. The top surfaces of the second semiconductor dies 702 and the third semiconductor dies 703 may be located within a horizontal plane including the top surface of the second MC matrix 722M.

The second MC matrix 722M includes a plurality of second molding compound (MC) die frames located within a respective unit area UA. Each second MC die frame corresponds to a portion of the second MC matrix 722M located within a unit area UA, i.e., an area of a single interposer to be subsequently formed. In other words, each portion of the second MC matrix 722M that is located within a respective unit area UA constitutes a second MC die frame. The second MC die frames are laterally adjoined to one another to provide a unitary structure, which is the second MC matrix 722M. The second sidewalls SW2 of each second semiconductor die 702 contact the second molding compound matrix 722M. The second MC matrix 722M laterally surrounds each of the underfill material portions 792.

Figure 10:
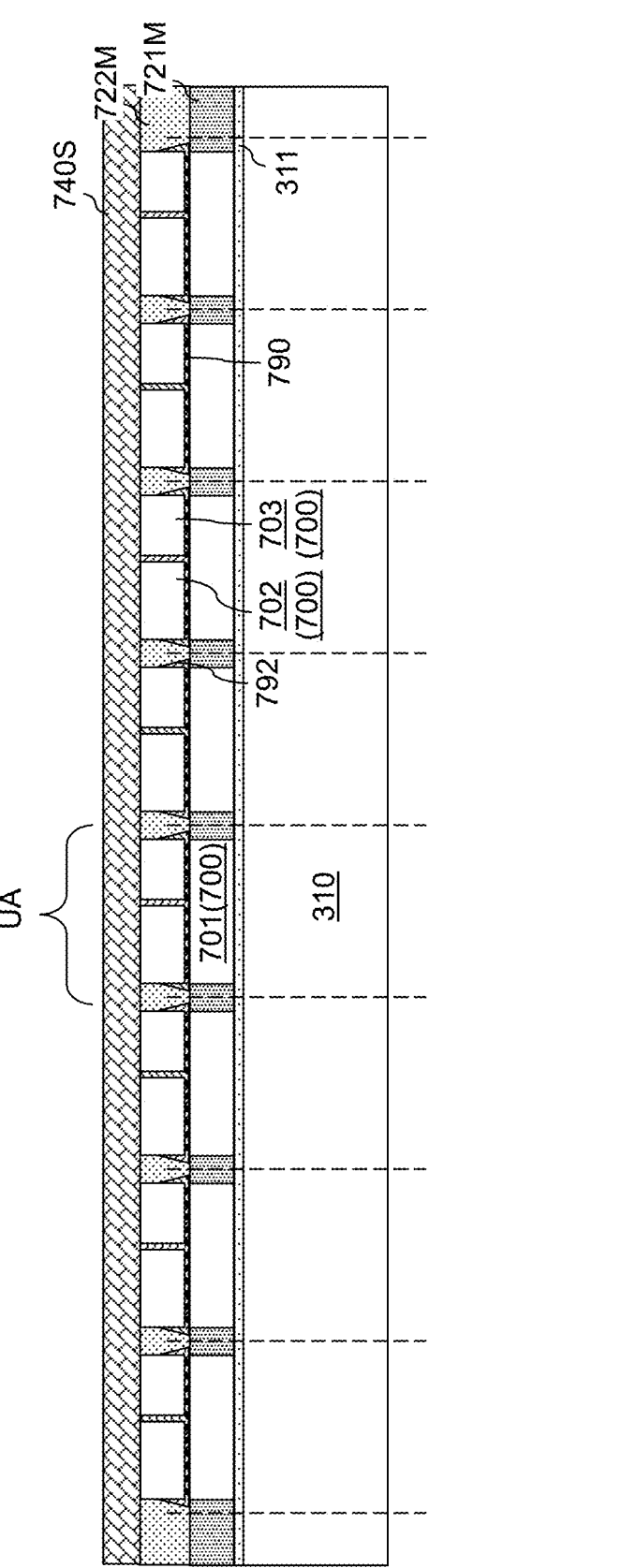
FIG. 10 is a vertical cross-sectional view of the structure after formation of a support wafer according to an embodiment of the present disclosure.

Referring to FIG. 10, a support wafer 740S may be optionally attached to the reconstituted wafer including the first semiconductor dies 701, the second semiconductor dies 702, the third semiconductor dies 703, the first MC matrix 721M, and the second MC matrix 722M. The support wafer 740S may comprise a semiconductor substrate, an insulating substrate, and a conductive substrate. The support wafer

740S has a thickness that provides sufficient mechanical support to the underlying assembly of the first semiconductor dies 701, the second semiconductor dies 702, the third semiconductor dies 703, the first MC matrix 721M, and the second MC matrix 722M upon subsequently detaching the carrier wafer 310. For example, the thickness of the support wafer 740S may be in a range from 60 microns to 1 mm, although lesser and greater thicknesses may also be used.

Figure 11:
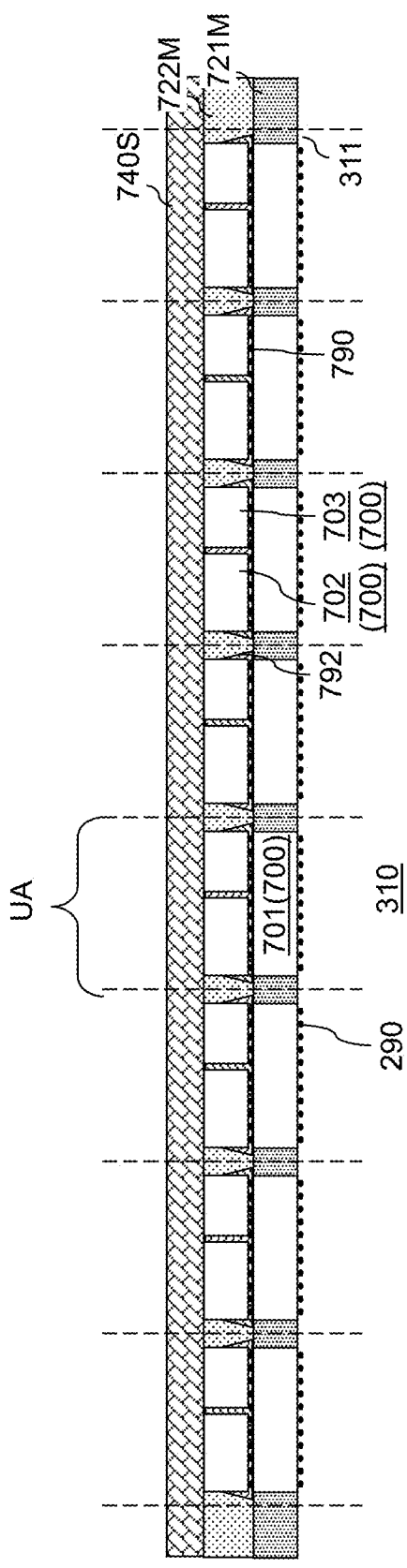
FIG. 11 is a vertical cross-sectional view of the structure after detaching the carrier wafer and formatting arrays of solder material portions according to an embodiment of the present disclosure.

Referring to FIG. 11, an ultraviolet radiation may be irradiated through the carrier wafer 310 onto the LTHC layer 311. Upon irradiation with the ultraviolet radiation, the LTHC layer 311 generates heat, and is decomposed. The carrier wafer 310 may be detached from the reconstituted wafer including the first semiconductor dies 701, the second semiconductor dies 702, the third semiconductor dies 703, the first MC matrix 721M, and the second MC matrix 722M, and the support wafer 740S. A suitable clean process may be performed to remove residual material portions from the decomposed LTHC layer 311.

Bonding structures of the first semiconductor dies 701 may be physically exposed upon removal of the LTHC layer 311. The physically exposed bonding structures of the first semiconductor dies 701 may comprise front bonding structures 98 or backside bonding structures 28. Solder material portions 290 may be attached to the physically exposed bonding structures of the first semiconductor dies 701.

Figure 12:
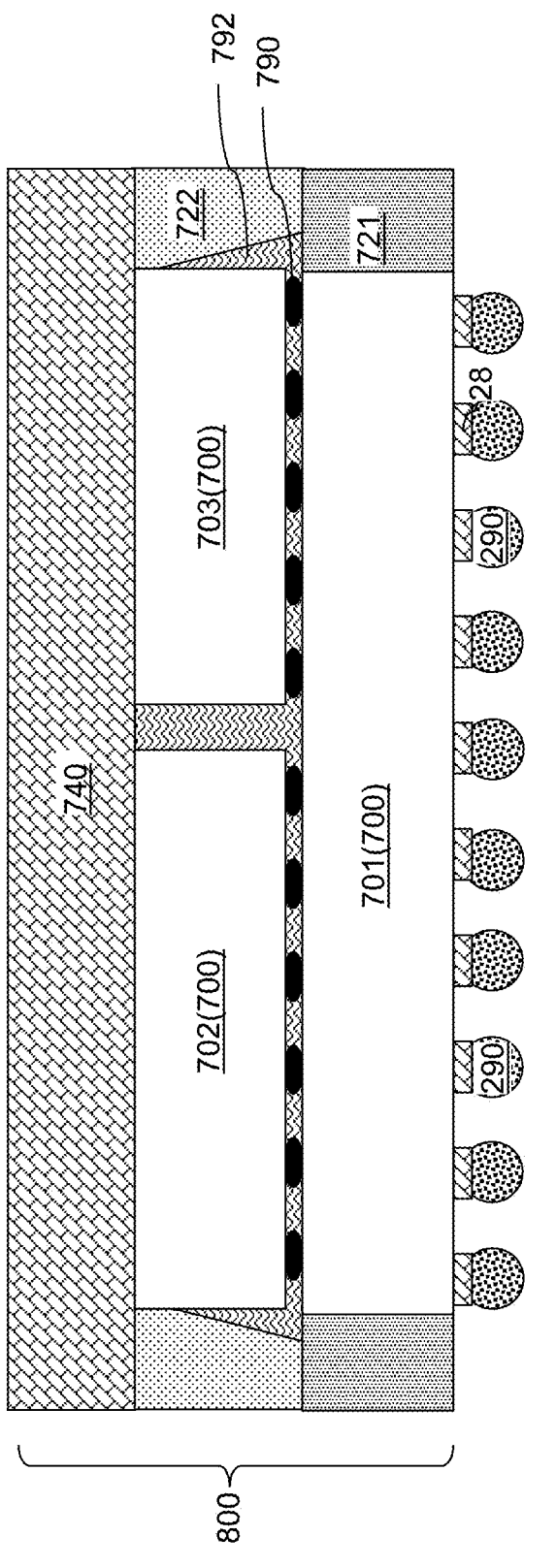
FIG. 12 is a vertical cross-sectional view of a composite package according to an embodiment of the present disclosure.

Referring to FIG. 12, the reconstituted wafer illustrated in FIG. 11 is diced along dicing channels, which may coincide with boundaries between neighboring pairs of unit areas UA. In other words, the first molding compound matrix 721M, the second molding compound matrix 722M, and the support wafer 740S are diced along the dicing channels. Each diced portion of the reconstituted wafer comprises a composite package 800. Each composite package 800 may comprise a first semiconductor die 701, a first molding compound die frame 721 which is a diced portion of the first molding compound matrix 721M, a second semiconductor die 702, an optional third semiconductor die 703, solder material portions 790 (which are also referred to as inter-die-bonding solder material portions), an underfill material portion 792, a second molding compound die frame 722 which is a diced portion of the second molding compound matrix 722M, and a support plate 740 which is a diced portion of the support wafer 740S. While the present disclosure is described using an embodiment in which the second semiconductor die 702 and the third semiconductor die 703 are bonded to the first semiconductor die 701 through the solder material portions 790, embodiments are expressly contemplated herein in which the second semiconductor die 702 and/or the optional third semiconductor die 703 are attached to the first semiconductor die 701 through metal-to-metal bonding in which the mating pairs of bonding structures direct contact each other and interdiffuse into each other to provide bonding interfaces.

Figure 13:
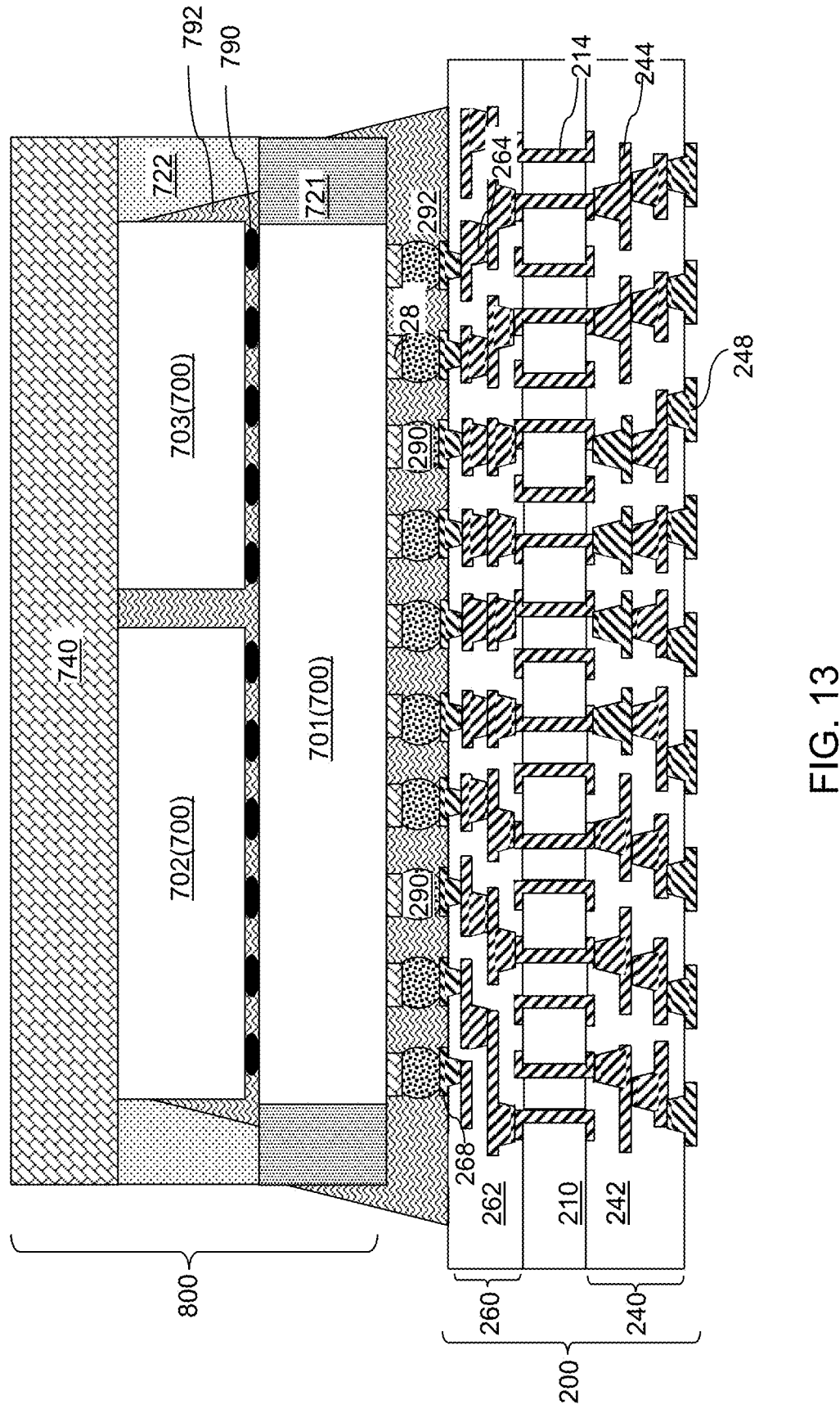
FIG. 13 is a structure including a bonded assembly of the composite package and a packaging substrate according to an embodiment of the present disclosure.

Referring to FIG. 13, a packaging substrate 200 may be bonded to the composite package 800. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers, dielectric interlayers, and/or at least one interposer (such as a silicon interposer) formed therein. Such a system-integrated packaging substrate may include layer-to-layer interconnections using solder material portions, microbumps, underfill material portions (such as molded underfill material portions), and/or an adhesion film. While the present disclosure is described using a cored packaging substrate, it is understood that the scope of the present disclosure is not limited by any particular type of substrate package. For example, an SoIS may be used in lieu of a cored packaging substrate. In embodiments in which SoIS is used, the core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners (not illustrated) may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 having formed therein board-side wiring interconnects 244. The chip-side SLC 260 may include chip-side insulating layers 262 having formed therein chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the chip-side surface laminar circuit 260 comprises chip-side wiring interconnects 264 that are connected to an array of substrate bonding pads 268. The array of substrate bonding pads 268 may be configured to allow bonding through C4 solder balls. The board-side surface laminar circuit 240 comprises board-side wiring interconnects 244 that are connected to an array of board-side bonding pads 248. The array of board-side bonding pads 248 is configured to allow bonding through solder joints having a greater dimension than the C4 solder balls. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

The composite package 800 may be attached to the packaging substrate 200 through the solder material portions 290, which are also referred to package-substrate-bonding (FSB) solder material portions 290. Specifically, each of the FSB solder material portions 290 may be bonded to a respective one of the substrate bonding pads 268 and to a respective one of the bonding structures located on the composite package 800. A reflow process may be performed to reflow the FSB solder material portions 290 such that each FSB solder material portion 290 may be bonded to a respective one of the substrate bonding pads 268 and to a respective one of the bonding structures 28.

An underfill material may be applied into a gap between the composite package 800 and the packaging substrate 200. The underfill material may comprise any underfill material known in the art. An underfill material portion may be formed around the FSB solder material portions 290 in the gap between the composite package 800 and the packaging substrate 200. This underfill material portion is herein referred to as an package-substrate underfill material portion 292, or as a PS underfill material portion 292.

Figure 14:
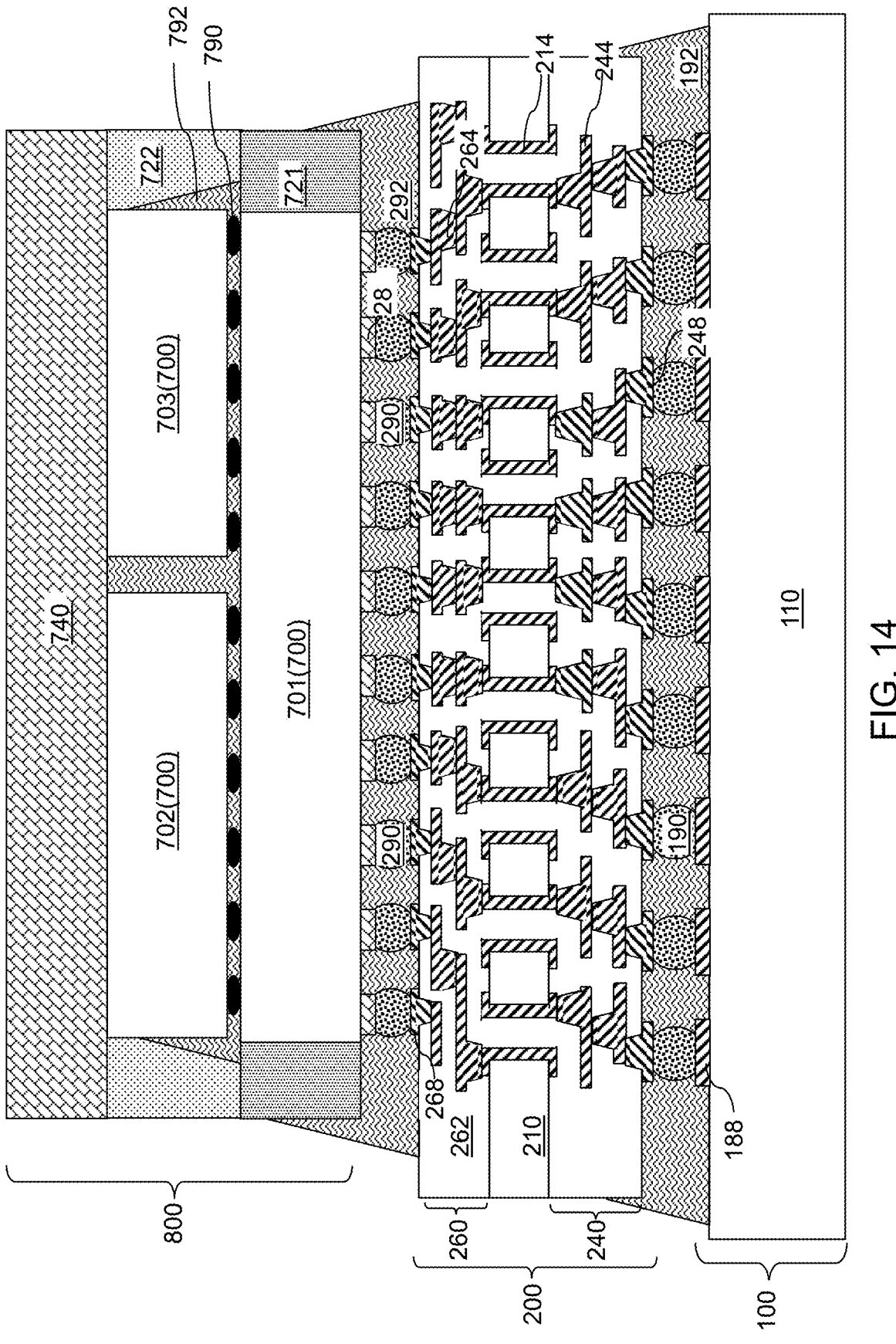
FIG. 14 is a structure including a bonded assembly of the composite package, the packaging substrate, and a printed circuit board according to an embodiment of the present disclosure.

Referring to FIG. 14, a printed circuit board (PCB) 100 including a PCB substrate 110 and PCB bonding pads 188 may be provided. The PCB 100 includes a printed circuitry (not shown) at least on one side of the PCB substrate 110. An array of solder joints 190 may be formed to bond the array of board-side bonding pads 248 to the array of PCB bonding pads 188. The solder joints 190 may be formed by disposing an array of solder balls between the array of board-side bonding pads 248 and the array of PCB bonding pads 188, and by reflowing the array of solder balls. An additional underfill material portion, which is herein referred to as a board-substrate underfill material portion 192 or a BS underfill material portion 192, may be formed around the solder joints 190 by applying and shaping an underfill material. The packaging substrate 200 is attached to the PCB 100 through the array of solder joints 190.

Figure 15:
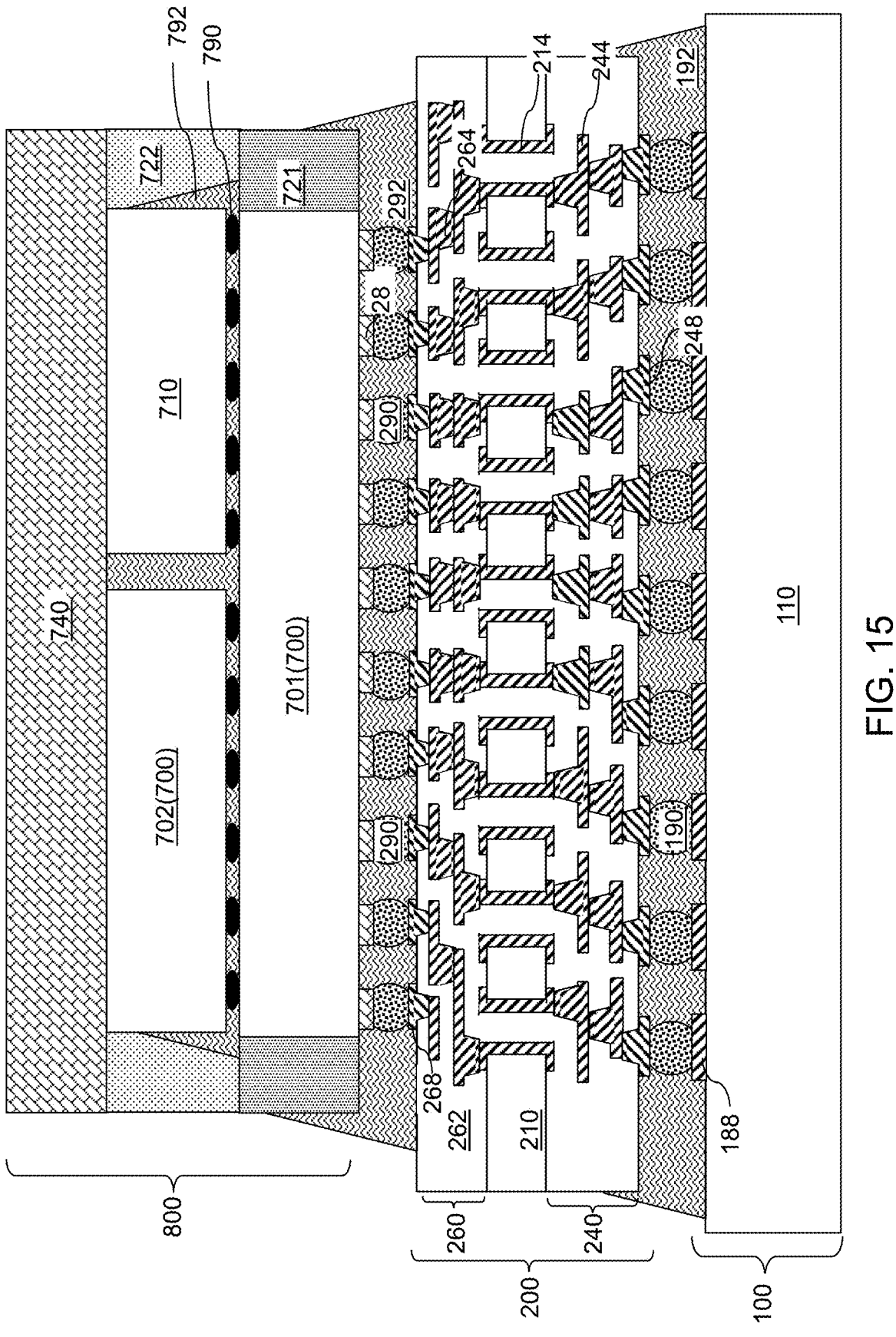
FIG. 15 is a first alternative structure according to an embodiment of the present disclosure.

Referring to FIG. 15, a first alternative embodiment structure according to an embodiment of the present disclosure may be derived from the embodiment structure illustrated in FIG. 14 by using at least one dummy die 710 in lieu of one or more of the semiconductor dies (701, 702, 703). In the illustrated example, the third semiconductor die 703 in the embodiment structure of FIG. 14 is replaced with a dummy die 710 that does not include any semiconductor device, and may, or may not, include a semiconductor substrate and/or an edge ring seal structure 61.

Figure 16:
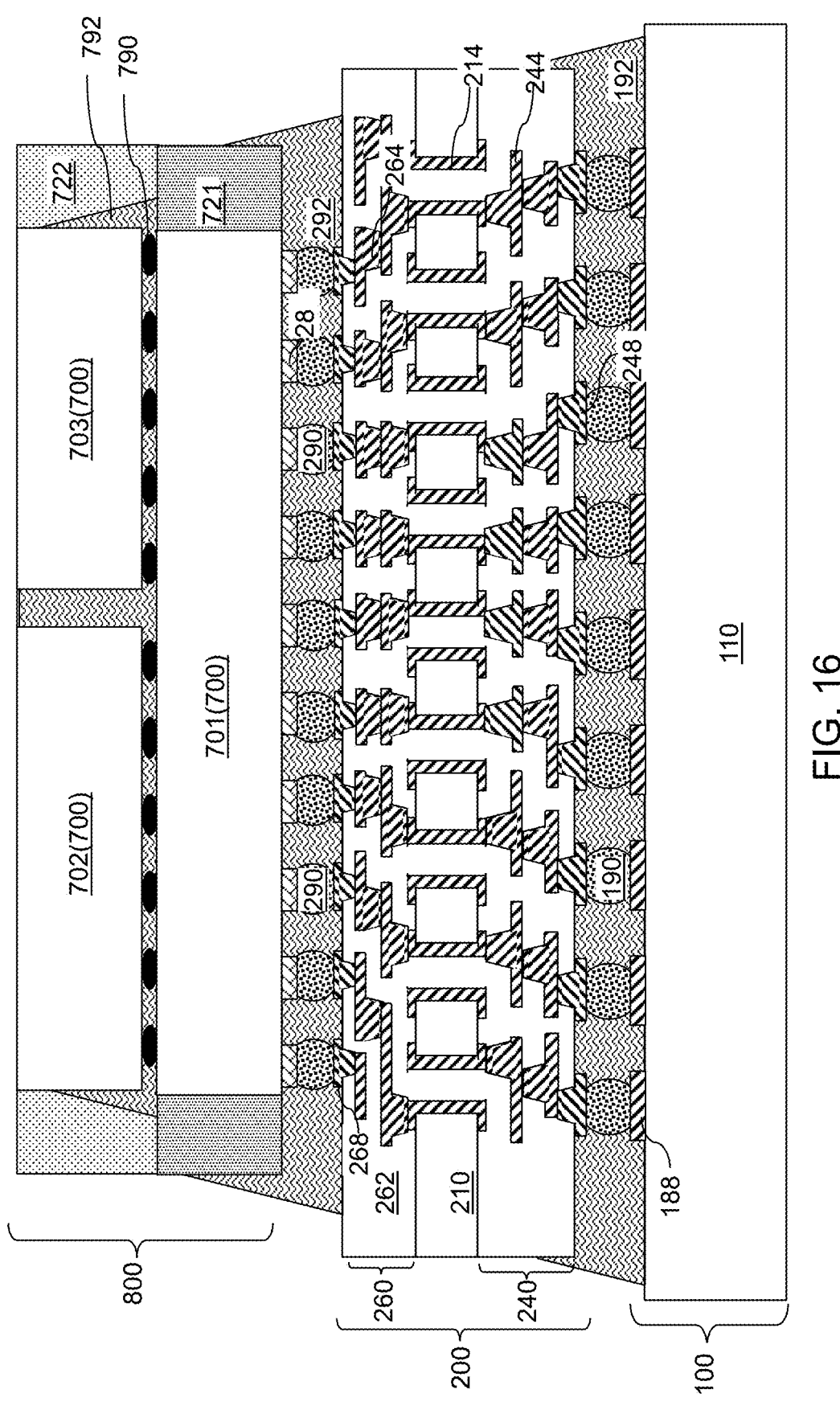
FIG. 16 is a second alternative structure according to an embodiment of the present disclosure.

Referring to FIG. 16, a second alternative embodiment structure according to an embodiment of the present disclosure may be derived from the embodiment structures of FIGS. 14 and 15 by omitting a support plate 740. In this embodiment, the processing step for attaching the support wafer 740S may be omitted.

Figure 17:
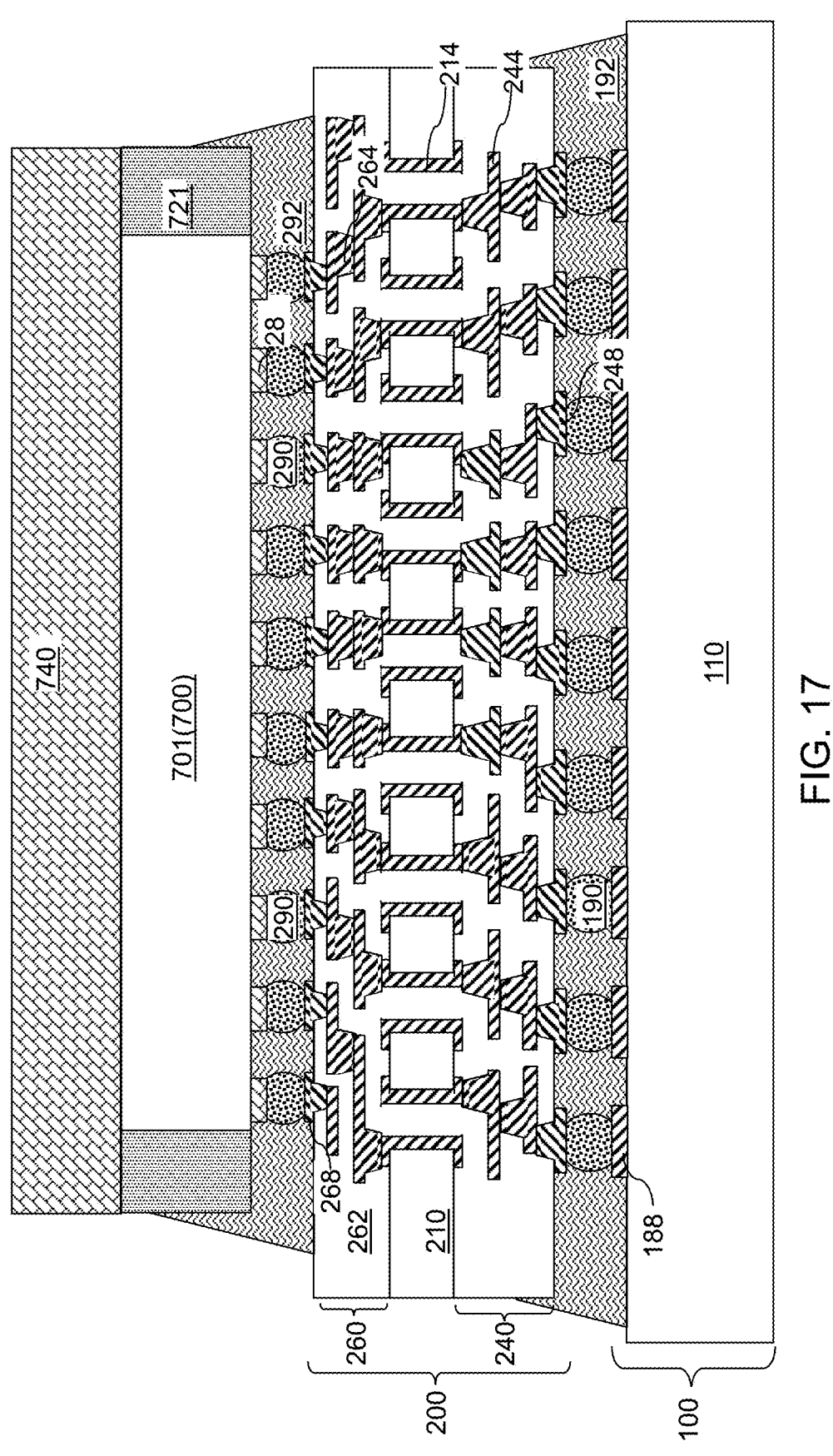
FIG. 17 is a third alternative structure according to an embodiment of the present disclosure.

Referring to FIG. 17, a third alternative embodiment structure according to an embodiment of the present disclosure may be derived from the embodiment structure of FIG. 14 by not using a second semiconductor die 702, a third semiconductor die 703, and a second molding compound die frame 722. In this embodiment, the processing steps described with reference to FIGS. 8 and 9 may be omitted.

Figure 18:
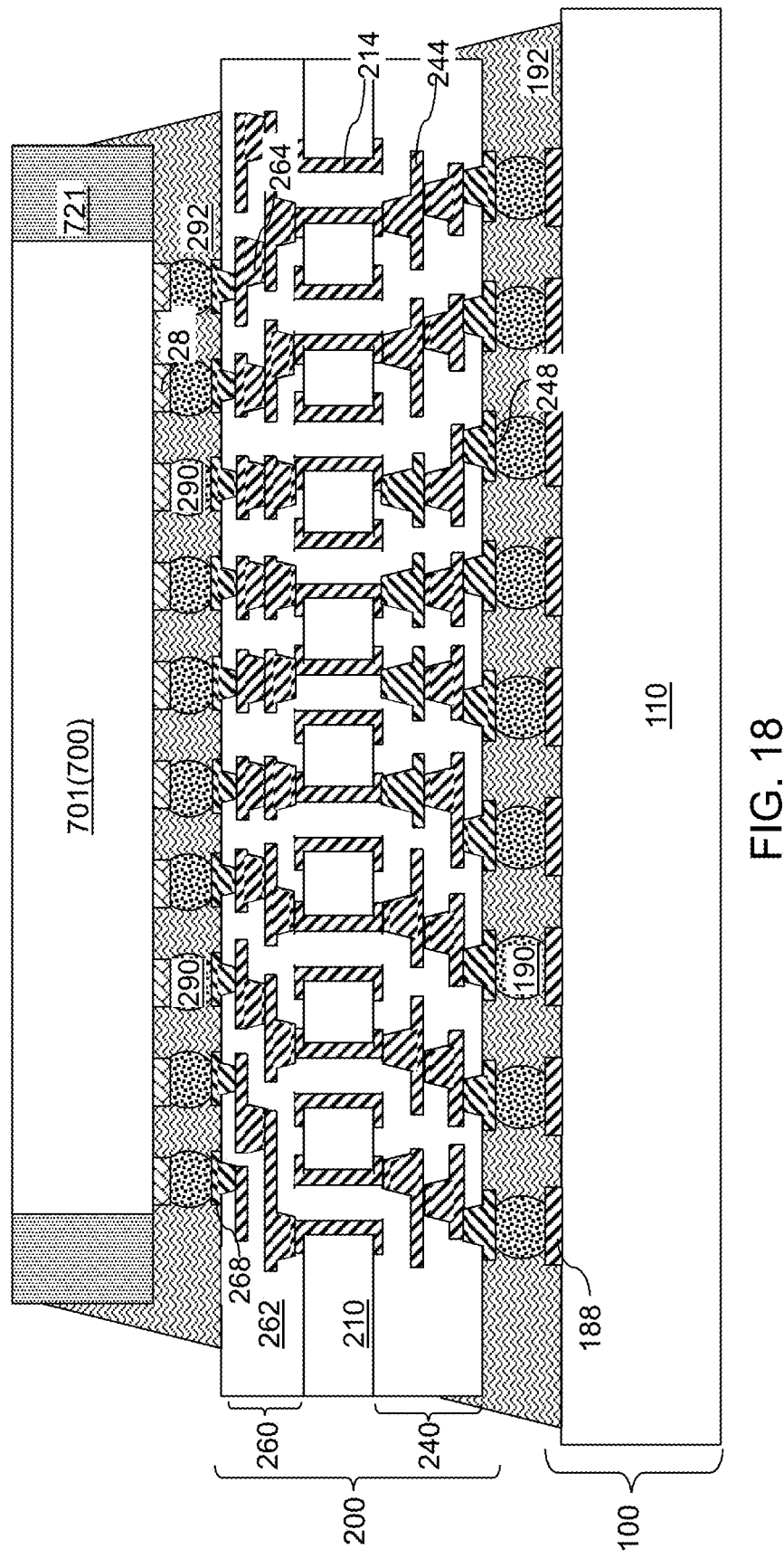
FIG. 18 is a fourth alternative structure according to an embodiment of the present disclosure.

Referring to FIG. 18, a fourth alternative embodiment structure according to an embodiment of the present disclosure may be derived from the embodiment structure of FIG. 17 by not using a support plate 740. In this embodiment, the processing step for attaching the support wafer 740S may be omitted.

FIG. 19 is a flowchart illustrating steps for forming a device structure according to an embodiment of the present disclosure.

Referring to step 1910 and FIGS. 1A-5C, dielectric material layers 70, metal interconnect structures 76, and an edge ring seal structure 61 may be formed over a semiconductor substrate 8. The edge ring seal structure 61 laterally enclosing the metal interconnect structures 76 without any lateral opening therethrough.

Referring to step 1920 and FIGS. 1A-5C, a capping metal ring 91 may be formed on a top surface segment of the edge ring seal structure 61. The capping metal ring 91 laterally encloses an entirety of the metal interconnect structures 76 in a plan view.

Referring to step 1930 and FIGS. 1A-5C, at least one passivation dielectric layer 80 may be formed over the dielectric material layers 70.

Referring to step 1940 and FIGS. 1A-5C, a first semiconductor die 701 may be formed by cutting through the at least one passivation dielectric layer 80, the dielectric material layers 70, and the semiconductor substrate 8.

In one embodiment, the edge ring seal structure 61 comprises two lengthwise segments that are parallel to first sidewalls SW1 of the first semiconductor die 701, two widthwise segments that are parallel to second sidewalls SW2 of the first semiconductor die 701, and four slanted corner segments SCS that connect a respective one of the two lengthwise segments and a respective one the two widthwise segments. In one embodiment, each corner region of the at least one passivation dielectric layer 80 in the first semiconductor die 701 that is located between a vertical plane VP including an inner sidewall of the four slanted corner segments SCS of the edge ring seal structure 61 and a vertical line containing a most proximal corner edge CE of the first semiconductor die 701 is free of any metallic material other than a respective single slanted bar segment of the capping metal ring 91.

Referring to all drawings and according to various embodiments of the present disclosure, a device structure comprising a composite package is provided. The composite package comprises a first semiconductor die 701 which comprises: a semiconductor substrate 8; dielectric material layers 70 overlying the semiconductor substrate 8; an edge ring seal structure 61 laterally enclosing the dielectric material layers 70 without any lateral opening therethrough; at least one passivation dielectric layer 80 overlying the dielectric material layers 70; and a capping metal ring 91 contacting a top surface segment of the edge ring seal structure 61 and laterally surrounding a lower portion 92A of the at least one passivation dielectric layer 80, wherein: the edge ring seal structure 61 comprises two lengthwise segments that are parallel to first sidewalls SW1 of the first semiconductor die 701, two widthwise segments that are parallel to second sidewalls SW2 of the first semiconductor die 701, and four slanted corner segments SCS that connect a respective one of the two lengthwise segments and a respective one the two widthwise segments; and each corner region of the at least one passivation dielectric layer 80 located between a vertical plane VP including an inner sidewall of the four slanted corner segments SCS of the edge ring seal structure 61 and a vertical line containing a most proximal corner edge CE of the first semiconductor die 701 is free of any metallic material other than a respective single slanted bar segment of the capping metal ring 91.

In one embodiment, the device structure comprises a first molding compound die frame 721 that laterally surrounds the first semiconductor die 701. In one embodiment, the device structure comprises: a second semiconductor die 702 overlying or underlying the first semiconductor die 701 and bonded to the first semiconductor die 701; and a second molding compound die frame 722 that laterally surrounds the first semiconductor die 701 and contacting a horizontal surface of the first molding compound die frame 721, wherein sidewalls of the second molding compound die frame 722 are vertically coincident with sidewalls of the first molding compound die frame 721.

In one embodiment, an entirety of a region of the at least one passivation dielectric layer 80 located between outer sidewalls of the capping metal ring 91 and a combination of the first sidewalls SW1 and the second sidewalls SW2 of the first semiconductor die 701 does not have formed therein any metallic material. In one embodiment, a peripheral region of the at least one passivation dielectric layer 80 located between outer sidewalls of the capping metal ring 91 and sidewalls of the first semiconductor die 701 has formed therein at least one metallic bar structure 95 having a same material composition as the capping metal ring 91 and laterally extending parallel to a respective sidewall of the first sidewalls SW1 and the second sidewalls SW2 of the first semiconductor die 701.

In one embodiment, the capping metal ring 91 comprises two first bar segments that are parallel to first sidewalls SW1 of the first semiconductor die 701, two second bar segments that are parallel to second sidewalls SW2 of the first semiconductor die 701, and four slanted bar segments that connect a respective one of the two first bar segments and a respective one the two second bar segments and located in a respective corner region of the at least one passivation dielectric layer 80. In one embodiment, each of the four slanted bar segments has a width in a range from 3.2 microns to 7.2 microns.

In one embodiment, each region at which one of the four slanted bar segments is adjoined to a respective one of the two first bar segments and the two second bar segments is laterally spaced from a sidewall selected from the two first sidewalls SW1 and the second sidewalls SW2 of the first semiconductor die 701 by an offset distance in a range from 27 microns to 90 microns. In one embodiment, a ratio of a length of one of the two first bar segments to a length of one of the first sidewalls SW1 of the first semiconductor die 701 is in a range from 0.8500 to 0.9948; and a ratio of a length of one of the two second bar segments to a length of one of the second sidewalls SW2 of the first semiconductor die 701 is in a range from 0.8500 to 0.9948.

In one embodiment, the dielectric material layers 70 overlie the semiconductor substrate 8 and have formed therein metal interconnect structures 76; and the edge ring seal structure 61 vertically extends from the semiconductor substrate 8 to a bottom surface of the at least one passivation dielectric layer 80. In one embodiment, the at least one passivation dielectric layer 80 comprises: a first passivation dielectric layer 81 contacting a topmost surface of the dielectric material layers 70; at least one second passivation dielectric layer 82 contacting a topmost surface of the capping metal ring 91; and a third passivation dielectric layer 83 overlying, and vertically spaced from, the capping metal ring 91. In one embodiment, the first semiconductor die 701 comprises a field effect transistor 510 located on, or above, the semiconductor substrate 8.

According to another aspect of the present disclosure, device structure comprising a composite package 800 is provided. The composite package 800 comprises a first semiconductor die 701 which comprises: a semiconductor substrate 8; dielectric material layers 70 overlying the semiconductor substrate 8; an edge ring seal structure 61 laterally enclosing the dielectric material layers 70 without any lateral opening therethrough; at least one passivation dielectric layer 80 overlying the dielectric material layers 70; a capping metal ring 91 contacting a top surface segment of the edge ring seal structure 61 and laterally surrounding a lower portion 92A of the at least one passivation dielectric layer 80; and a spacer metal ring 92 formed within the at least one passivation dielectric layer 80 and located inside the capping metal ring 91 and having a topmost surface that is located above a horizontal plane including a topmost surface of the capping metal ring 91.

In one embodiment, a lower portion 92A of the spacer metal ring 92 has a same material composition as the capping metal ring 91 and comprises a horizontal surface located within a horizontal plane including a topmost surface of the capping metal ring 91; and an upper portion 92B of the spacer metal ring 92 has a different material composition than the capping metal ring 91.

In one embodiment, the at least one passivation dielectric layer 80 comprises: a first passivation dielectric layer 81 contacting a topmost surface of the dielectric material layers 70; at least one second passivation dielectric layer 82 contacting a topmost surface of the capping metal ring 91; and a third passivation dielectric layer 83 overlying, and vertically spaced from, the capping metal ring 91.

The various embodiments of the present disclosure may be used to reduce mechanical stress applied to corner regions of a semiconductor die 700 that is laterally surrounded by a molding compound die frame (721, 722) in a composite package 800 during operation due to mismatch of thermal expansion coefficients between components of the semiconductor die 700 and the molding compound die frame (721, 722). Simulations performed by the inventors of the present disclosure show a reduction in mechanical stress by up to 60% at the four corner edges CE of the semiconductor dies 700 of the present disclosure, and a reduction in mechanical stress by up to 30% at joints between the inner slanted corner segments and a respective one of the lengthwise segments and the widthwise segments of an edge ring seal structure 61 compared to reference structures that do not use any of the inventive features of the present disclosure.

The foregoing outlines features of several embodiments so that those skilled in the art may better understand the aspects of the present disclosure. Each embodiment described using the term "comprises" also inherently discloses additional embodiments in which the term "comprises" is replaced with "consists essentially of" or with the term "consists of," unless expressly disclosed otherwise herein. Whenever two or more elements are listed as alternatives in a same paragraph of in different paragraphs, a Markush group including a listing of the two or more elements is also impliedly disclosed. Whenever the auxiliary verb "can" is used in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure comprising a composite package, wherein the composite package comprises a first semiconductor die which comprises:

a semiconductor substrate;

dielectric material layers overlying the semiconductor substrate;

an edge ring seal structure laterally enclosing the dielectric material layers;

at least one passivation dielectric layer overlying the dielectric material layers; and a capping metal ring contacting a top surface segment of the edge ring seal structure and laterally surrounding a lower portion of the at least one passivation dielectric layer, wherein:

the edge ring seal structure comprises two lengthwise segments that are parallel to first sidewalls of the first semiconductor die, two widthwise segments that are parallel to second sidewalls of the first semiconductor die, and four slanted corner segments that connect a respective one of the two lengthwise segments and a respective one the two widthwise segments; and a corner region of the at least one passivation dielectric layer located between a vertical plane including an inner sidewall of the four slanted corner segments of the edge ring seal structure and a vertical line containing a most proximal corner edge of the first semiconductor die is free of any metallic material other than a respective single slanted bar segment of the capping metal ring.

2. The device structure of claim 1, further comprising a first molding compound die frame that laterally surrounds the first semiconductor die.

3. The device structure of claim 2, further comprising:

a second semiconductor die overlying or underlying the first semiconductor die and bonded to the first semiconductor die; and a second molding compound die frame that laterally surrounds the first semiconductor die and contacting a horizontal surface of the first molding compound die frame, wherein sidewalls of the second molding compound die frame are vertically coincident with sidewalls of the first molding compound die frame.

4. The device structure of claim 1, wherein an entirety of a region of the at least one passivation dielectric layer located between outer sidewalls of the capping metal ring and a combination of the first sidewalls and the second sidewalls of the first semiconductor die having no metallic material formed therein.

5. The device structure of claim 1, wherein a peripheral region of the at least one passivation dielectric layer located between outer sidewalls of the capping metal ring and sidewalls of the first semiconductor die has formed therein at least one metallic bar structure having a same material composition as the capping metal ring and laterally extending parallel to a respective sidewall of the first sidewalls and the second sidewalls of the first semiconductor die.

6. The device structure of claim 1, wherein the capping metal ring comprises two first bar segments that are parallel to first sidewalls of the first semiconductor die, two second bar segments that are parallel to second sidewalls of the first semiconductor die, and four slanted bar segments that connect a respective one of the two first bar segments and a respective one the two second bar segments and located in the corner region of the at least one passivation dielectric layer.

7. The device structure of claim 6, wherein the four slanted bar segments has a width in a range from 3.2 microns to 7.2 microns.

8. The device structure of claim 6, wherein the region at which the four slanted bar segments is adjoined to a respective one of the two first bar segments and the two second bar segments is laterally spaced from a sidewall selected from the two first sidewalls and the second sidewalls of the first semiconductor die by an offset distance in a range from 27 microns to 90 microns.

9. The device structure of claim 6, wherein:

a ratio of a length of one of the two first bar segments to a length of one of the first sidewalls of the first semiconductor die is in a range from 0.8500 to 0.9948; and a ratio of a length of one of the two second bar segments to a length of one of the second sidewalls of the first semiconductor die is in a range from 0.8500 to 0.9948.

10. The device structure of claim 1, wherein:

the dielectric material layers overlie the semiconductor substrate and has formed therein metal interconnect structures; and the edge ring seal structure vertically extends from the semiconductor substrate to a bottom surface of the at least one passivation dielectric layer.

11. The device structure of claim 1, wherein the at least one passivation dielectric layer comprises:

a first passivation dielectric layer contacting a topmost surface of the dielectric material layers;

at least one second passivation dielectric layer contacting a topmost surface of the capping metal ring; and a third passivation dielectric layer overlying, and vertically spaced from, the capping metal ring.

12. The device structure of claim 1, wherein the first semiconductor die comprises a field effect transistor located on, or above, the semiconductor substrate.

13. A device structure comprising a composite package, wherein the composite package comprises a first semiconductor die which comprises:

a semiconductor substrate;

dielectric material layers overlying the semiconductor substrate;

an edge ring seal structure laterally enclosing the dielectric material layers without any lateral opening therethrough;

at least one passivation dielectric layer overlying the dielectric material layers;

a capping metal ring contacting a top surface segment of the edge ring seal structure and laterally surrounding a lower portion of the at least one passivation dielectric layer; and a spacer metal ring formed within the at least one passivation dielectric layer and located inside the capping metal ring and having a topmost surface that is located above a horizontal plane including a topmost surface of the capping metal ring.

14. The device structure of claim 13, wherein:

a lower portion of the spacer metal ring has a same material composition as the capping metal ring and comprises a horizontal surface located within a horizontal plane including a topmost surface of the capping metal ring; and an upper portion of the spacer metal ring has a different material composition than the capping metal ring.

15. The device structure of claim 13, wherein the at least one passivation dielectric layer comprises:

a first passivation dielectric layer contacting a topmost surface of the dielectric material layers;

at least one second passivation dielectric layer contacting a topmost surface of the capping metal ring; and a third passivation dielectric layer overlying, and vertically spaced from, the capping metal ring.

16. A device structure comprising a composite package, wherein the composite package comprises a first semiconductor die, the first semiconductor die comprising:

a semiconductor substrate;

dielectric material layers overlying the semiconductor substrate;

an edge ring seal structure laterally enclosing the dielectric material layers without any lateral opening therethrough, wherein the edge ring seal structure comprises two lengthwise segments, two widthwise segments, and four slanted corner segments;

at least one passivation dielectric layer overlying the dielectric material layers; and a capping metal ring contacting a top surface segment of the edge ring seal structure and laterally surrounding a lower portion of the at least one passivation dielectric layer, wherein a corner region of the at least one passivation dielectric layer, located between a vertical plane including an inner sidewall of the four slanted corner segments of the edge ring seal structure and a vertical line containing a most proximal corner edge of the first semiconductor die, is free of any metallic material other than a respective single slanted bar segment of the capping metal ring.

17. The device structure of claim 16, further comprising:

a first molding compound die frame that laterally surrounds the first semiconductor die;

a second semiconductor die overlying or underlying the first semiconductor die and bonded to the first semiconductor die; and a second molding compound die frame that laterally surrounds the first semiconductor die and contacts a horizontal surface of the first molding compound die frame.

18. The device structure of claim 16, wherein the capping metal ring comprises:

two first bar segments that are parallel to first sidewalls of the first semiconductor die;

two second bar segments that are parallel to second sidewalls of the first semiconductor die; and four slanted bar segments that connect a respective one of the two first bar segments and a respective one the two second bar segments and are located in a respective corner region of the at least one passivation dielectric layer.

19. The device structure of claim 18, wherein a region at which the four slanted bar segments is adjoined to a respective one of the two first bar segments and the two second bar segments is laterally spaced from a sidewall selected from the two first sidewalls and the two second sidewalls of the first semiconductor die by an offset distance in a range from 27 microns to 90 microns.

20. The device structure of claim 16, further comprising a spacer metal ring formed within the at least one passivation dielectric layer and located inside the capping metal ring, the spacer metal ring having a topmost surface that is located above a horizontal plane including a topmost surface of the capping metal ring.

* * * * *